US010622366B2

(12) United States Patent
Chavan et al.

(10) Patent No.: US 10,622,366 B2
(45) Date of Patent: *Apr. 14, 2020

(54) METHODS OF FORMING AN ARRAY COMPRISING PAIRS OF VERTICALLY OPPOSED CAPACITORS AND ARRAYS COMPRISING PAIRS OF VERTICALLY OPPOSED CAPACITORS

(71) Applicant: Micron Technology, Inc., Boise, ID (US)

(72) Inventors: Ashonita A. Chavan, Boise, ID (US); Durai Vishak Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/912,826

(22) Filed: Mar. 6, 2018

(65) Prior Publication Data

US 2018/0197869 A1    Jul. 12, 2018

Related U.S. Application Data

(63) Continuation of application No. 15/402,679, filed on Jan. 10, 2017, now Pat. No. 9,935,114.

(51) Int. Cl.
*H01L 21/02* (2006.01)
*H01L 27/11507* (2017.01)
*H01L 27/11514* (2017.01)

(52) U.S. Cl.
CPC .. *H01L 27/11507* (2013.01); *H01L 27/11514* (2013.01)

(58) Field of Classification Search
USPC ....... 257/295, 751, 774, 762, 200, 758, 288, 257/298, E21.579, 776, E21.568, 773,
(Continued)

(56) References Cited

U.S. PATENT DOCUMENTS

| 5,291,438 A | 3/1994 | Witek et al. |
| 5,336,917 A | 8/1994 | Kohyama |

(Continued)

FOREIGN PATENT DOCUMENTS

| CN | 1500292 | 5/2004 |
| JP | 10-242410 | 9/1998 |

(Continued)

*Primary Examiner* — Niki H Nguyen
(74) *Attorney, Agent, or Firm* — Wells St. John P.S.

(57) ABSTRACT

A method of forming an array comprising pairs of vertically opposed capacitors comprises forming a conductive lining in individual capacitor openings in support material. An elevational mid-portion of individual of the conductive linings is removed to form an upper capacitor electrode lining and a lower capacitor electrode lining that are elevationally separate and spaced from one another in the individual capacitor openings. A capacitor insulator is formed laterally outward of the upper and lower capacitor electrode linings. Conductive material is formed laterally outward of the capacitor insulator to comprise a shared capacitor electrode that is shared by vertically opposed capacitors in individual of the pairs of vertically opposed capacitors. Other methods and structure independent of method of manufacture are disclosed.

19 Claims, 23 Drawing Sheets

(58) Field of Classification Search
USPC ............ 257/374, 499–564, 763, 757, 68–71, 257/296–309, 905–908, 257/E27.084–E27.097, E27.075, 257/E21.645–E21.694; 438/762, 639, 438/687, 637, 582, 99, 15, 3, 669, 709, 438/730, 597, 299, 448, 396, 253, 200, 438/656, 642, 640, 627, 648, 662
See application file for complete search history.

(56) References Cited

U.S. PATENT DOCUMENTS

| | | |
|---|---|---|
| 5,414,289 A | 5/1995 | Fitch et al. |
| 5,578,850 A | 11/1996 | Fitch et al. |
| 5,874,757 A | 2/1999 | Chao |
| 5,950,084 A | 9/1999 | Chao |
| 6,277,687 B1 | 8/2001 | Agarwal |
| 6,437,401 B1 | 8/2002 | Mandelman et al. |
| 8,772,771 B2 | 7/2014 | Tanaka |
| 8,847,353 B2 | 9/2014 | Hasunuma |
| 9,287,270 B2 | 3/2016 | Oh et al. |
| 9,312,257 B2 | 4/2016 | Yamazaki et al. |
| 9,324,730 B2* | 4/2016 | Nam ................. H01L 27/11582 |
| 9,337,149 B2 | 5/2016 | Im et al. |
| 9,613,981 B2* | 4/2017 | Huo ..................... H01L 21/764 |
| 9,748,273 B2 | 8/2017 | Yamazaki et al. |
| 9,761,580 B1 | 9/2017 | Ramaswamy |
| 9,799,724 B2 | 10/2017 | Lee et al. |
| 9,935,114 B1* | 4/2018 | Chavan ............. H01L 27/11507 |
| 10,038,011 B2 | 7/2018 | Yamazaki et al. |
| 10,062,745 B2 | 8/2018 | Ramaswamy |
| 2002/0015322 A1 | 2/2002 | Cloud et al. |
| 2002/0109176 A1 | 8/2002 | Forbes et al. |
| 2002/0154900 A1 | 10/2002 | Shimada |
| 2003/0082875 A1 | 5/2003 | Lee |
| 2004/0169217 A1 | 9/2004 | Houston |
| 2004/0235240 A1 | 11/2004 | Hsu et al. |
| 2005/0145911 A1 | 7/2005 | Forbes et al. |
| 2005/0164454 A1 | 7/2005 | Leslie |
| 2005/0164481 A1 | 7/2005 | Deboer et al. |
| 2008/0042179 A1 | 2/2008 | Haller |
| 2008/0173920 A1 | 7/2008 | Juengiing |
| 2009/0078981 A1 | 3/2009 | Yokoi |
| 2010/0135064 A1 | 6/2010 | Kim et al. |
| 2011/0079836 A1 | 4/2011 | Lin |
| 2011/0249500 A1 | 10/2011 | Cha |
| 2012/0153371 A1 | 6/2012 | Chen et al. |
| 2012/0231601 A1 | 9/2012 | Lee et al. |
| 2013/0001663 A1 | 1/2013 | Abbott et al. |
| 2013/0001666 A1 | 1/2013 | Heineck et al. |
| 2013/0037879 A1 | 2/2013 | Filippini et al. |
| 2013/0234240 A1 | 9/2013 | Moon et al. |
| 2013/0240965 A1 | 9/2013 | Park et al. |
| 2013/0330891 A1 | 12/2013 | Chang et al. |
| 2015/0221718 A1 | 8/2015 | Rhie |
| 2015/0318296 A1* | 11/2015 | Kim ..................... H01L 27/1157 257/296 |
| 2016/0093611 A1 | 3/2016 | Cheng et al. |
| 2016/0126290 A1 | 5/2016 | Sills et al. |
| 2016/0204122 A1* | 7/2016 | Shoji ................. H01L 27/11582 257/324 |
| 2018/0061840 A1 | 3/2018 | Sills |
| 2018/0096947 A1 | 4/2018 | Lee et al. |
| 2018/0122817 A1 | 5/2018 | Ramaswamy |
| 2018/0315658 A1 | 11/2018 | Ramaswamy |

FOREIGN PATENT DOCUMENTS

| | | |
|---|---|---|
| JP | 2008-182083 | 8/2008 |
| KR | 2010-0062609 | 6/2010 |
| KR | 10-1057746 | 8/2011 |
| KR | 2013-0106159 | 9/2013 |
| TW | 571384 | 1/2004 |
| TW | 200816454 | 4/2008 |
| TW | 200845308 | 11/2008 |
| TW | 201225260 | 6/2012 |
| TW | 201546804 | 12/2016 |
| TW | 107100725 | 7/2018 |
| WO | WO PCT/US2017/068219 | 4/2018 |
| WO | WO PCT/US2017/068219 | 7/2019 |

* cited by examiner

METHODS OF FORMING AN ARRAY COMPRISING PAIRS OF VERTICALLY OPPOSED CAPACITORS AND ARRAYS COMPRISING PAIRS OF VERTICALLY OPPOSED CAPACITORS

TECHNICAL FIELD

Embodiments disclosed herein pertain to methods of forming an array comprising pairs of vertically opposed capacitors and to arrays comprising pairs of vertically opposed capacitors.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bit lines, data lines, sense lines, or data/sense lines) and access lines (which may also be referred to as word lines). The digit lines may conductively interconnect memory cells along columns of the array, and the access lines may conductively interconnect memory cells along rows of the array. Each memory cell may be uniquely addressed through the combination of a digit line and an access line.

Memory cells may be volatile or non-volatile. Non-volatile memory cells can store data for extended periods of time including when the computer is turned off. Volatile memory dissipates and therefore requires being refreshed/rewritten, in many instances multiple times per second. Regardless, memory cells are configured to retain or store memory in at least two different selectable states. In a binary system, the states are considered as either a "0" or a "1". In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. Depending on composition of the insulating material, that stored field may be volatile or non-volatile. For example, a capacitor insulator material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages, and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor. One type of memory cell has a select device electrically coupled in series with a ferroelectric capacitor.

Other programmable materials may be used as a capacitor insulator to render capacitors non-volatile. Further and regardless, arrays of capacitors may be formed as part of an array of memory cells or an array in other integrated circuitry.

DETAILED DESCRIPTION OF EXAMPLE EMBODIMENTS

Embodiments of the invention encompass methods of forming an array comprising pairs of vertically opposed capacitors and also such arrays independent of method of manufacture. Example embodiments of methods of forming such arrays are initially described with reference to FIGS. 1-19.

Figure 1:
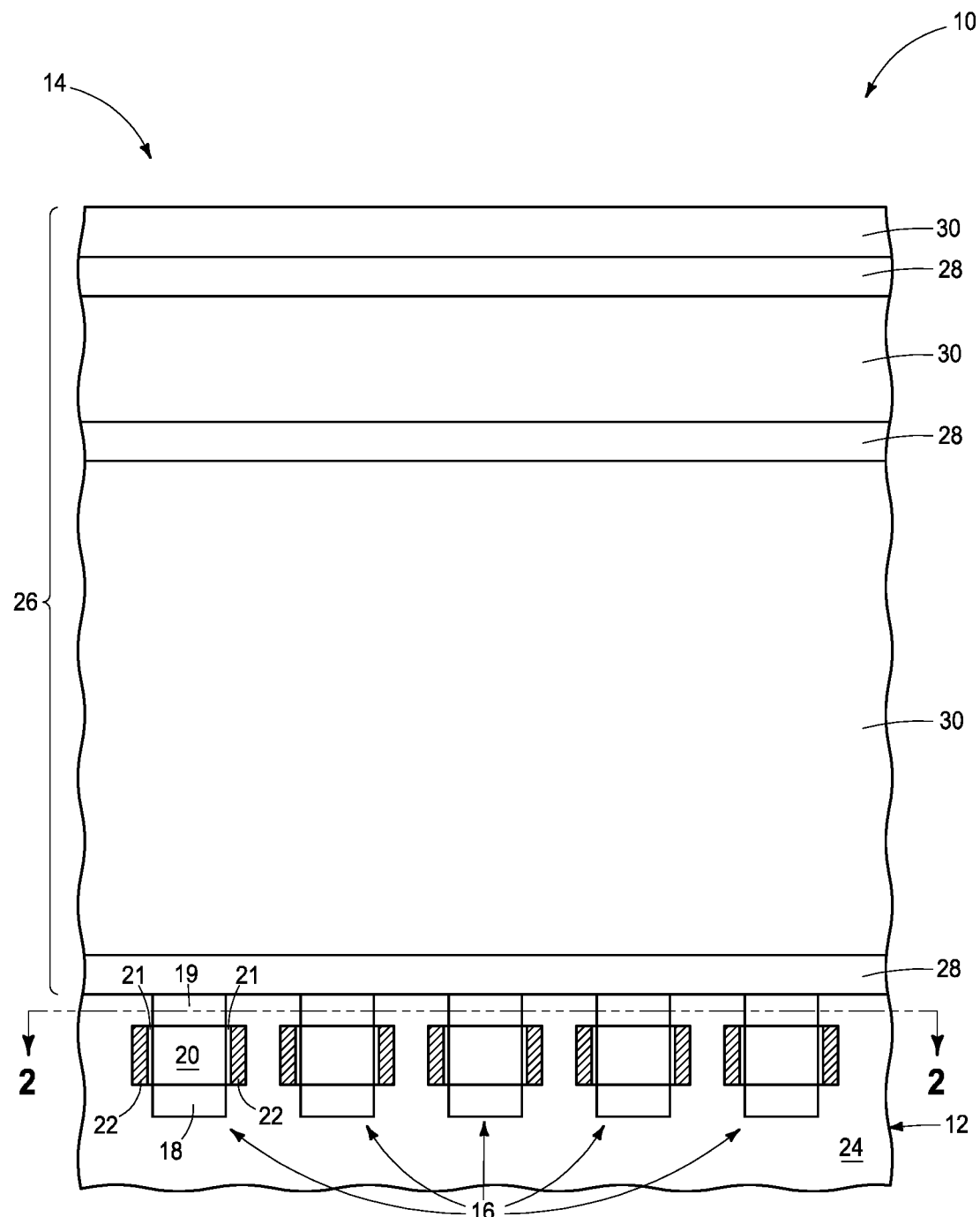
FIG. 1 is a diagrammatic cross-sectional view of a substrate construction in process in accordance with an embodiment of the invention, and is taken through line 1-1 in FIG. 2.
Figure 2:
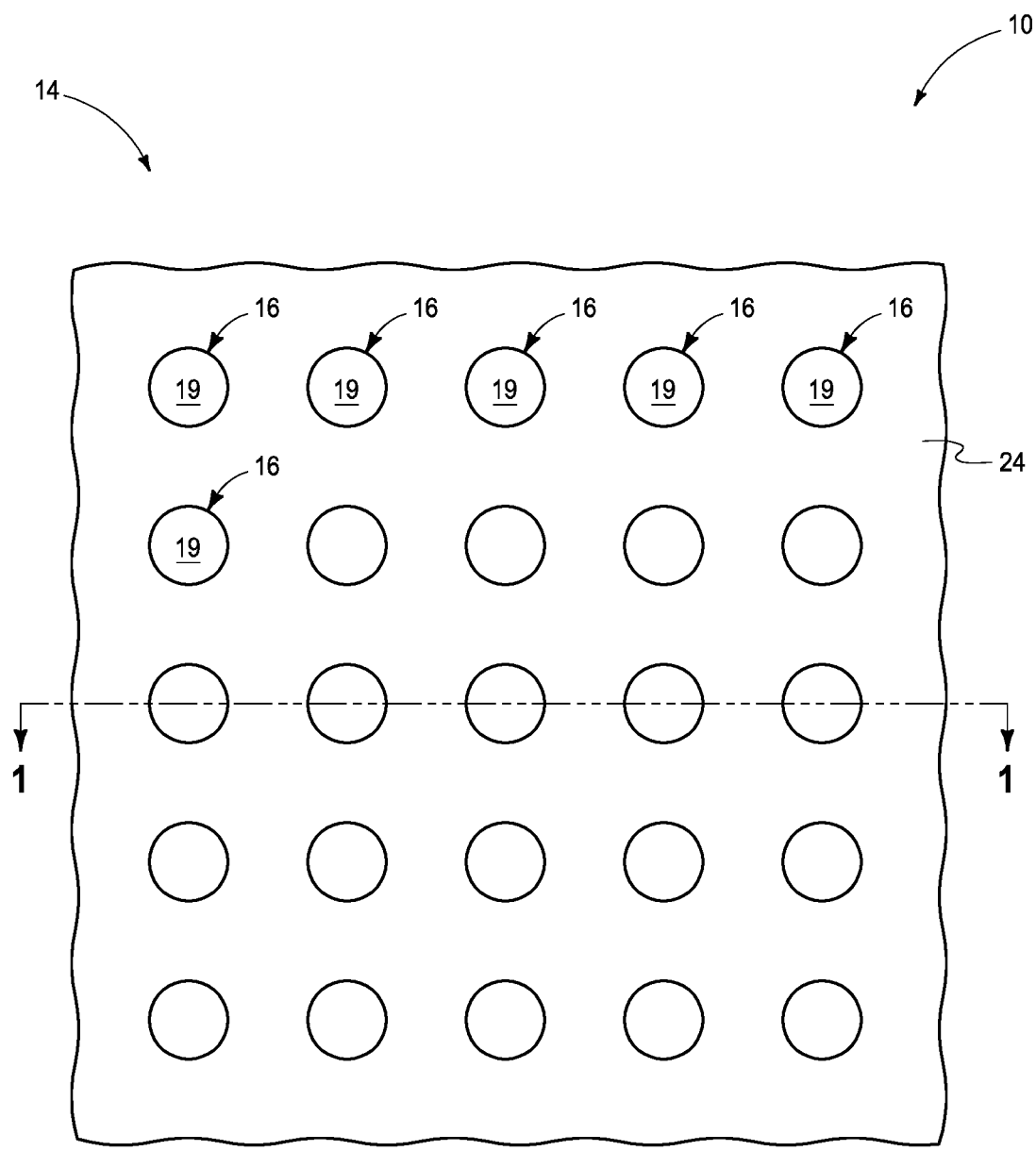
FIG. 2 is a cross-sectional view taken through line 2-2 in FIG. 1.

Referring to FIGS. 1 and 2, such depict a portion of a substrate fragment or construction 10 comprising a base substrate 12 having an array or array area 14 within which pairs of vertically opposed capacitors will be fabricated. An area (not shown) is peripheral to array 14 and may be fabricated to include circuit components (i.e., circuitry). Base substrate 12 may include any one or more of conductive/conductor/conducting (i.e., electrically herein), semiconductive, or insulative/insulator/insulating (i.e., electrically herein) materials. Various materials are shown above base substrate 12. Materials may be aside, elevationally inward, or elevationally outward of the depicted FIGS. 1 and 2 materials. For example, other partially or wholly fabricated components of integrated circuitry may be provided somewhere above, about, or within substrate 12 (e.g., transistors 16 being shown). Control and/or other peripheral circuitry for operating components within an array such as a memory array may also be fabricated, and may or may not be wholly or partially within an array or sub-array. Further, multiple sub-arrays may also be fabricated and operated independently, in tandem, or otherwise relative one another. As used in this document, a "sub-array" may also be considered as an array. Regardless, any of the materials, regions, and structures described herein may be homogenous or non-homogenous, and regardless may be continuous or discontinuous over any material which such overlie. Further, unless otherwise stated, each material may be formed using any suitable existing or yet-to-be-developed technique, with atomic layer deposition, chemical vapor deposition, physical vapor deposition, epitaxial growth, diffusion doping, and ion implanting being examples.

In one embodiment, transistors 16 in base substrate 12 extend elevationally (e.g., vertically) and individually comprise a lower source/drain region 18, an upper source/drain region 19, a channel region 20 (e.g., polysilicon) elevationally there-between, and a conductive gate 22 operatively adjacent channel region 20, with a gate insulator 21 being between conductive gate 22 and channel region 20. In this document, unless otherwise indicated, "elevational(ly)", "higher", "upper", "lower", "top", "atop", "bottom", "above, "below", "under", "beneath", "up", and "down" are generally with reference to the vertical direction. Further, "vertical" and "horizontal" as used herein are directions that are perpendicular or within 10 degrees of perpendicular relative one another independent of orientation of the substrate in three-dimensional space. "Horizontal" refers to a general direction (i.e., within 10 degrees) along a primary substrate surface and may be relative to which the substrate is processed during fabrication. Also, "extend(ing) elevationally" and "elevationally-extending" in this document encompasses a range from vertical to no more than 45° from vertical. Further, "extend(ing) elevationally", "elevationally-extending", and "vertical(ly)" with respect to a field effect transistor are with reference to orientation of the transistor's channel length along which current flows in operation between two source/drain regions of the transistor that are at two different elevations. In some embodiments, transistors 16 are referred to as lower transistors as contrasted relative to other transistors that are referred to as upper transistors.

Transistors 16 may be provided for accessing and/or controlling capacitor devices to be fabricated in a lower tier there-over in memory or other circuitry, for example as will be apparent below. Gates 22 of transistors 16 may completely encircle (not shown) respective channels 20 or may only be over a portion of the circumference of channels 20, for example only over opposing sides of a channel 20. Regardless and depending on circuitry architecture, some or all of gates 22 may interconnect relative one another (not shown) along a line of such transistors. Only twenty-five transistors 16 are shown in FIGS. 1 and 2 for simplicity and clarity, although hundreds, thousands, millions, etc. would likely be formed within array 14. A material 24 is shown surrounding transistors 16 and may comprise, for example, semiconductive and/or insulative materials (e.g., monocrystalline silicon and doped or undoped silicon dioxide) not particularly germane to the invention.

Material 26, also referred to herein as support material 26, has been formed over base substrate 12. Such may comprise any one or combination of insulative, semiconductive, or conductive materials depending on which portions thereof may be wholly or partially sacrificial or remain in the finished circuitry construction. By way of example only, support material 26 is shown as comprising alternating materials 28 and 30 where material 28 remains as part of the finished circuitry construction. An example material 28 is silicon nitride, while an example material 30 is doped and/or undoped silicon dioxide (e.g., phosphosilicate glass and/or borophosphosilicate glass). An example thickness for support material 26 is from 0.5 micron to 1.5 microns.

In this document, "thickness" by itself (no preceding directional adjective) is defined as the mean straight-line distance through a given material or region perpendicularly from a closest surface of an immediately adjacent material of different composition or of an immediately adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Figure 3:
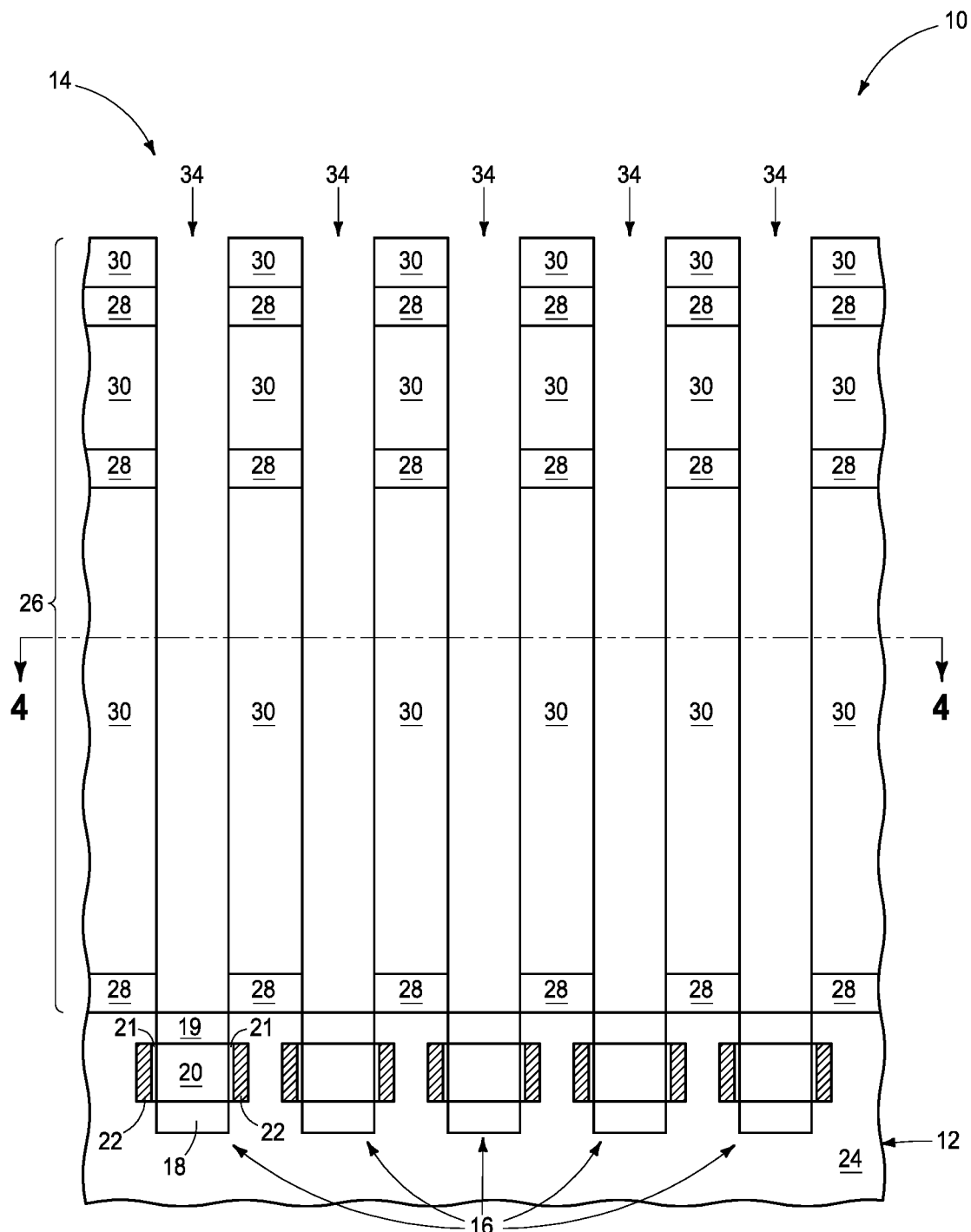
FIG. 3 is a view of the FIG. 1 construction at a processing step subsequent to that shown by FIG. 1, and is taken through line 3-3 in FIG. 4.
Figure 4:
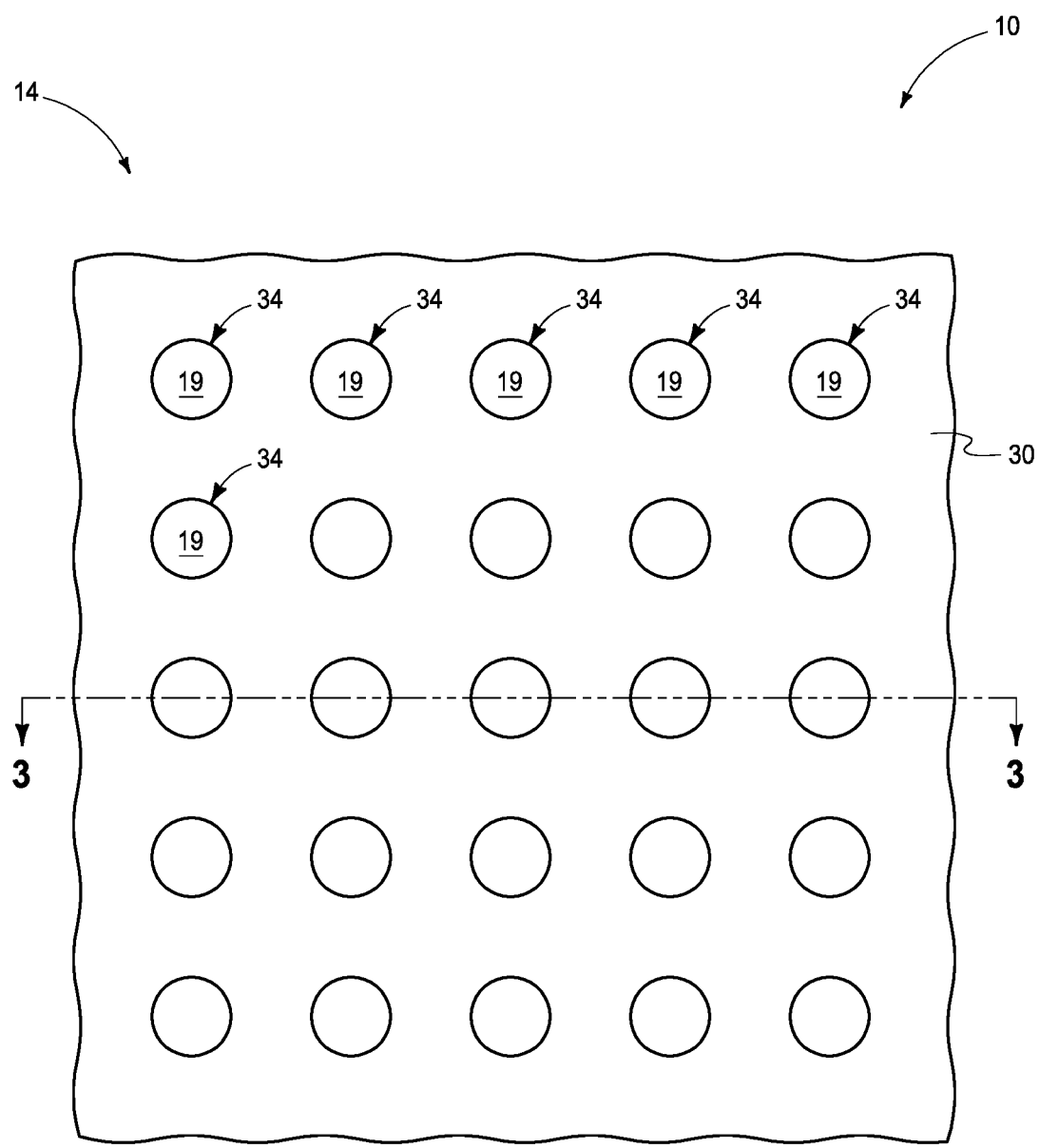
FIG. 4 is a cross-sectional view taken through line 4-4 in FIG. 3.

Referring to FIGS. 3 and 4, capacitor openings 34 having been formed in support material 26. For simplicity and clarity, array 14 is only shown as comprising twenty-five capacitor openings 34, although again likely hundreds, thousands, millions, etc. would be formed within array 14. In one embodiment and as shown, individual capacitor openings 34 extend through materials 28 and 30 to a node location (e.g., individual upper source/drain regions 19 of transistors 16). An example technique for forming capacitor openings 34 includes photolithographic patterning and etch with or without pitch multiplication. An etch stop layer (not shown) may be provided atop or as part of upper source/drain regions 19. When used, such may or may not be ultimately removed depending on whether it is conductive. An example anisotropic plasma chemistry for etching through silicon dioxide is a combination of $C_4F_6$, $C_4F_8$, and Ar, while that for etching through silicon nitride is a combination of $CH_2F_2$, $CF_4$, and $O_2$. Capacitor openings 34 may individually be of any one or more shapes in horizontal cross-section, for example circular, ellipsoidal, 4-sided (e.g., square or rectangular), 6-sided, a combination of straight and curved sides, etc. Capacitor openings 34 are shown as having straight vertical sidewalls, although such may be non-vertical and/or not straight. An example maximum open dimension for individual capacitor openings 34 is 300 to 600 Angstroms.

Figure 5:
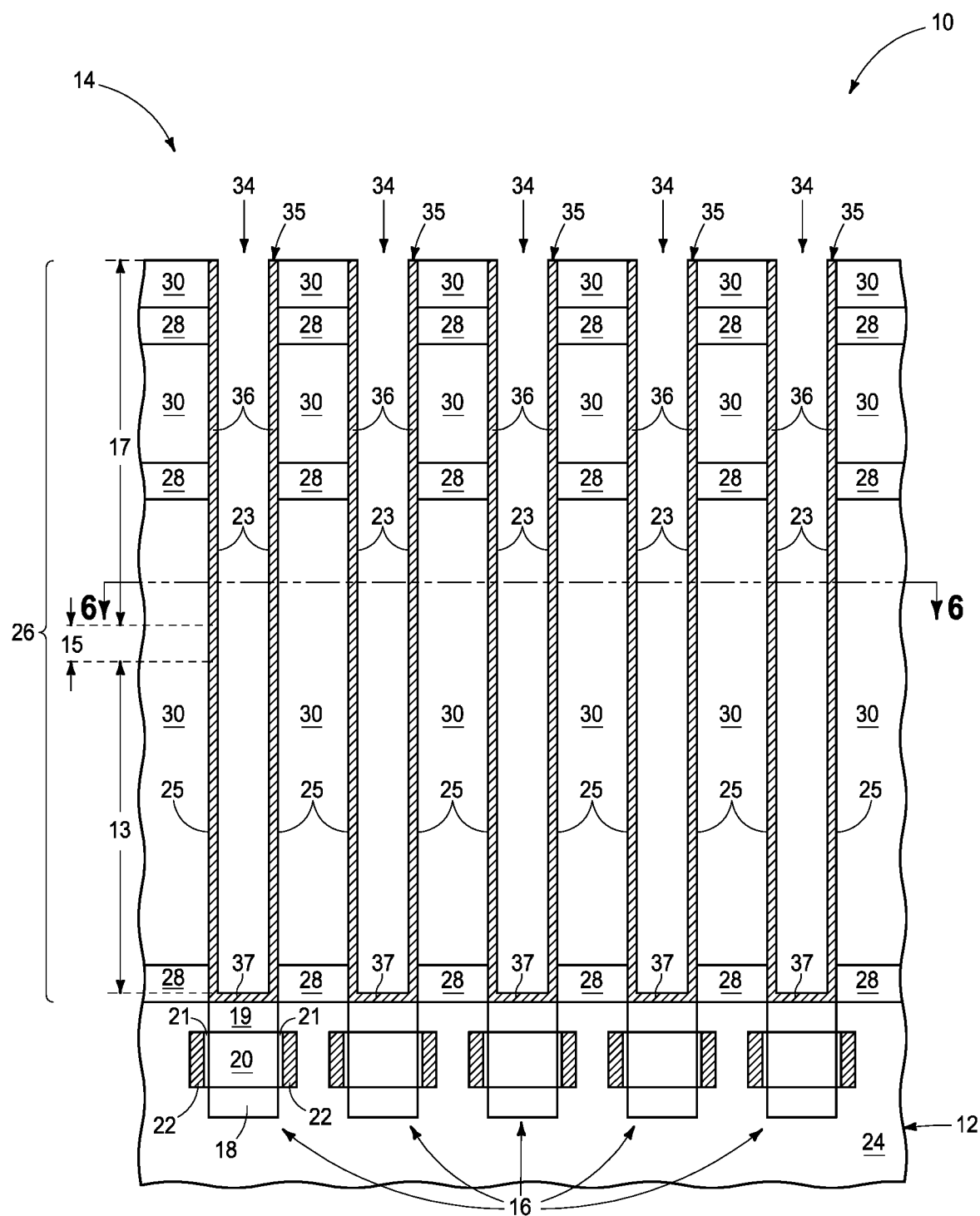
FIG. 5 is a view of the FIG. 3 construction at a processing step subsequent to that shown by FIG. 3, and is taken through line 5-5 in FIG. 6.
Figure 6:
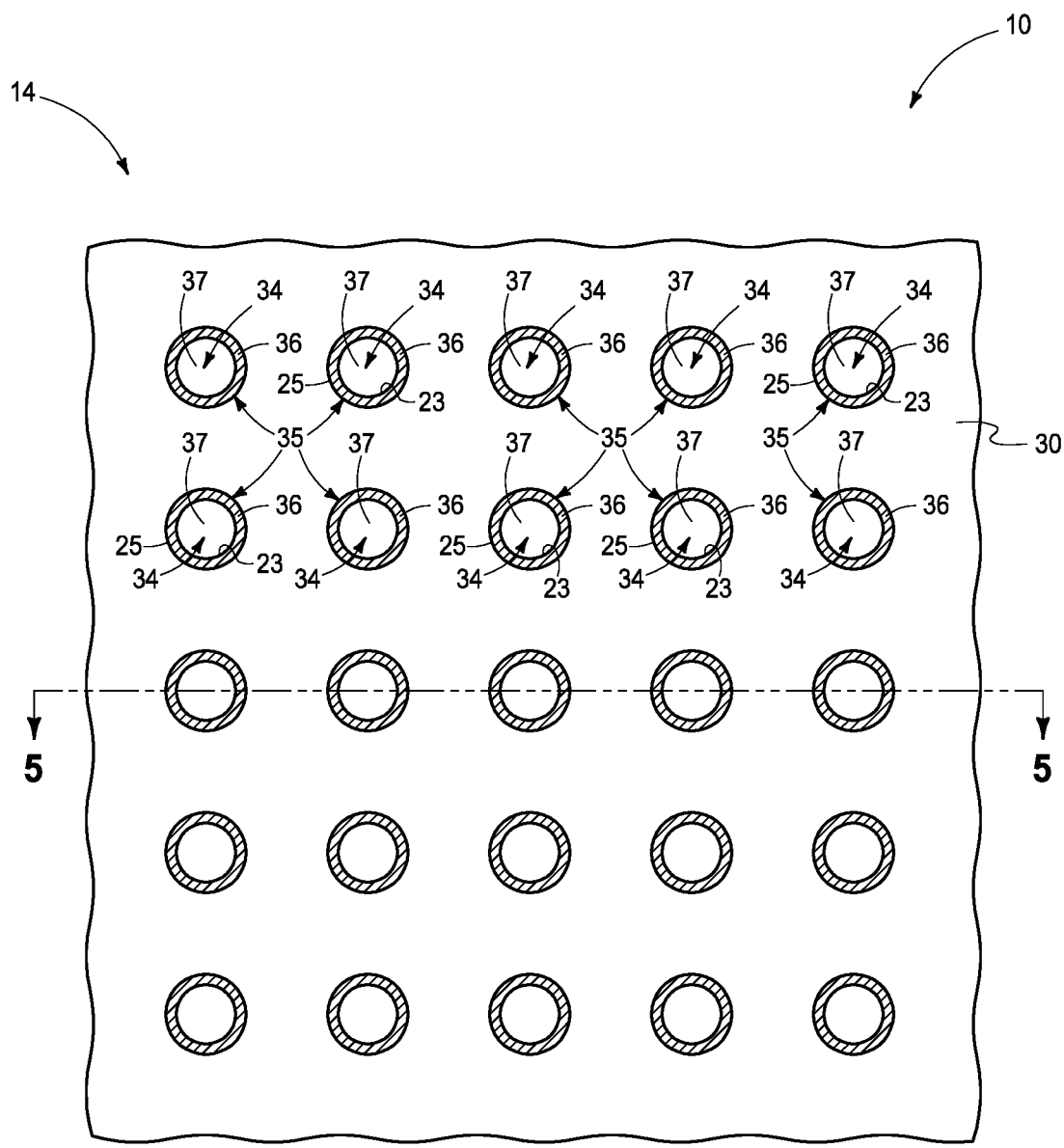
FIG. 6 is a cross-sectional view taken through line 6-6 in FIG. 5.

Referring to FIGS. 5 and 6, a conductive lining 35 has been formed in individual capacitor openings 34. Example conductive material for linings 35 are one or more of elemental metal, a mixture or alloy of two or more elemental metals, conductive metal compounds, and conductively-doped semiconductive materials, with TiN being one specific example. In one embodiment, conductive lining 35 is formed to be upwardly open. In one such embodiment and as shown, conductive linings 35 in individual capacitor openings 34 comprise a container shape comprising sidewalls 36 and a bottom 37 extending laterally to and between sidewalls 36. Alternately and by way of example only, upwardly-open conductive linings may individually comprise an upwardly and downwardly-open (not shown) conductive material cylinder (e.g., little or no bottom 37 extending between sidewalls 36). For purposes of the continuing discussion, sidewalls 36 and correspondingly conductive linings 35 may be considered as having laterally-internal sides 23 and laterally-outer sides 25. Further, sidewalls 36 and their respective laterally-internal and laterally-outer sides may be considered as comprising a lower portion 13, a mid-portion 15, and an upper portion 17. Mid-portion may or may not be centrally located relative to the top and bottom of support material 26, with "mid" only requiring that there be some upper portion above a mid-portion and some lower portion below a mid-portion. Regardless, an example elevational thickness for a mid-portion 15 is 300 to 1,000 Angstroms.

Conductive linings 35 extend to and electrically couple (in one embodiment directly electrically couple) to individual node locations (e.g., individual upper source/drain regions 19). In this document, regions/materials/components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions/materials/components. In contrast, when regions/materials/components are referred to as being "directly electrically coupled", no intervening electronic component (e.g., no diode, transistor, resistor, transducer, switch, fuse, etc.) is between the directly electrically coupled regions/materials/components. The node locations may or may not be electrically conductive at this point of processing. An example technique for forming conductive linings 35 is deposition of conductive material thereof to the depicted thickness, followed by planarizing such back at least to an uppermost surface of upper insulative material 28. An example thickness for conductive linings 35 is 30 to 50 Angstroms.

Figure 7:
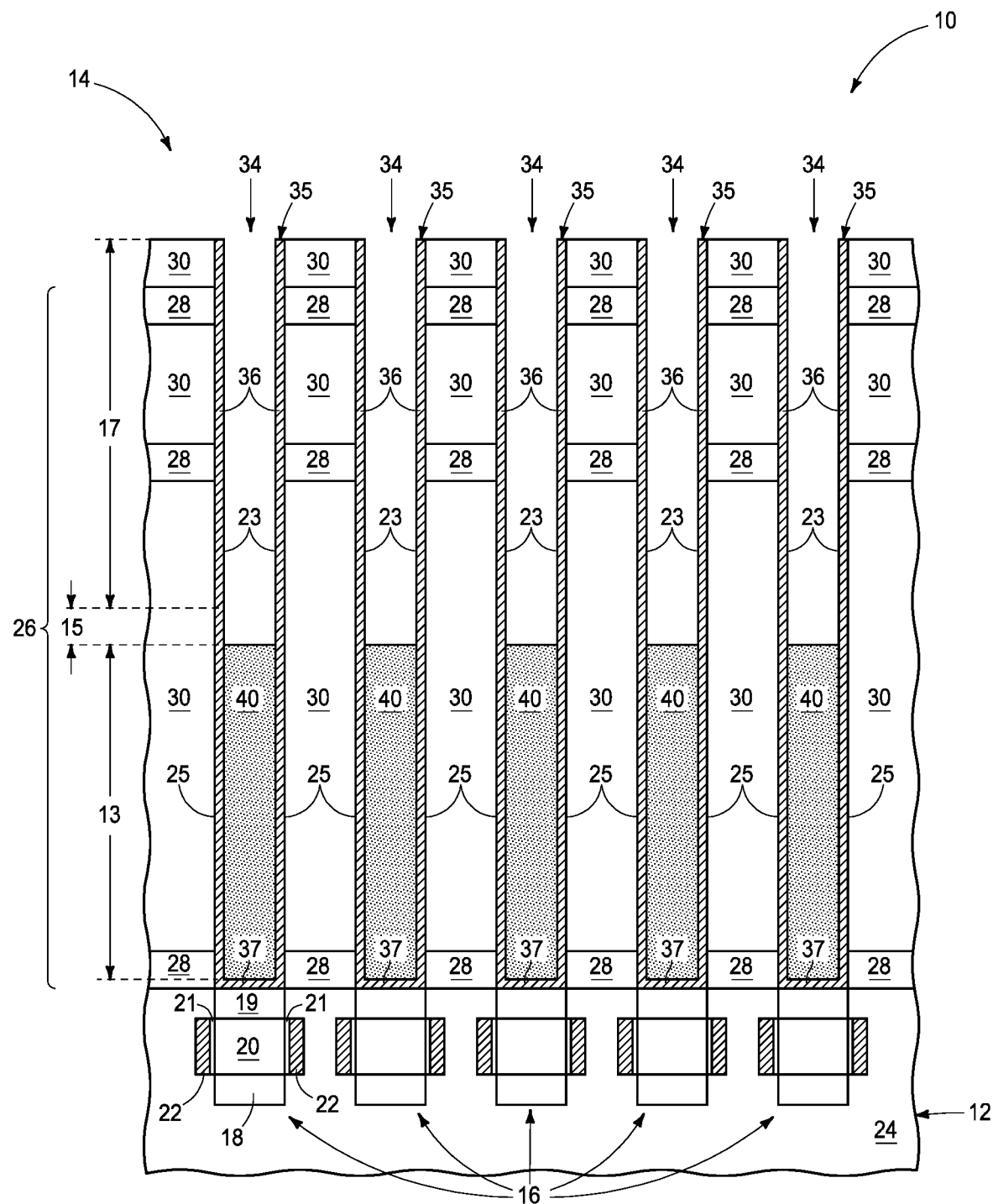
FIG. 7 is a view of the FIG. 5 construction at a processing step subsequent to that shown by FIG. 5.

Referring to FIG. 7, lower portion 13 of individual capacitor openings 34 has been filled with a first material 40 that is also over laterally-internal sides 23 of sidewalls 36 of individual conductive linings 35. First material 40 may be sacrificial, with one example being photoresist that has been deposited and then etched back as shown. Such is but one example technique of masking laterally-internal sides 23 of sidewalls 36 of individual lower portions 13 of individual conductive linings 35. Alternate existing or yet-to-be-developed techniques may be used. As examples, material 40 may not be formed in the lowest portions of the capacitor openings (e.g., a void space [not shown] being thereunder) or with material 40 being formed as a lining (not shown) that less-than-fills lower portions 13 of conductive linings 35.

Figure 8:
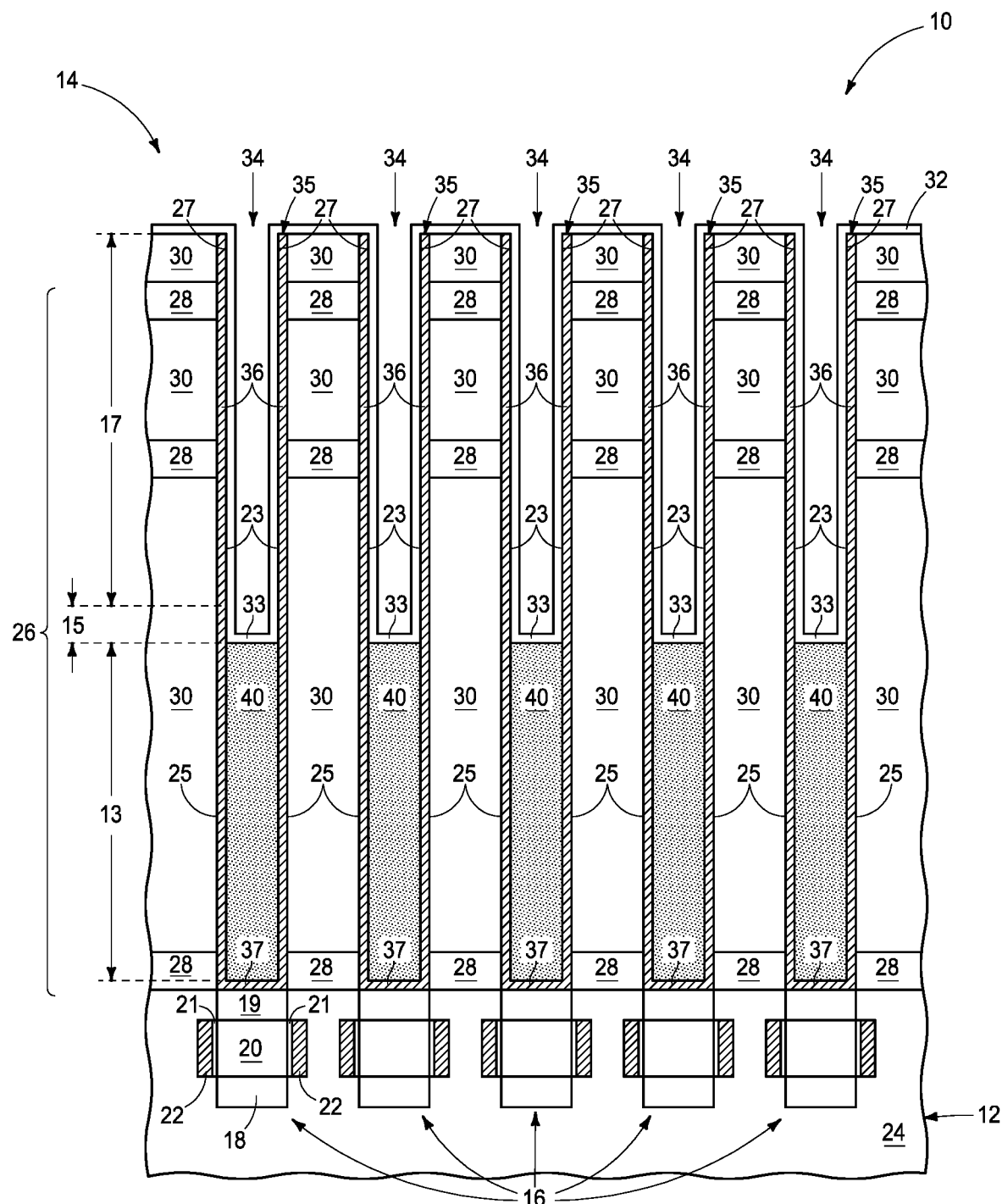
FIG. 8 is a view of the FIG. 7 construction at a processing step subsequent to that shown by FIG. 7.

Referring to FIG. 8, upper portions 17 of laterally-internal sides 23 of sidewalls 36 of conductive linings 35 within individual capacitor openings 34 have been lined with a second material 32. Second material lining 32 less-than-fills remaining volume of individual capacitor openings 34 laterally between laterally-outer sides (e.g., 27) of second material lining 32 in horizontal cross-section. Second material lining 32 comprises a laterally-extending bottom 33 which covers atop (in one embodiment, is directly against) all of first material 40 in capacitor openings 34. Second material 32 may be sacrificial wherein such may be any of conductive, semiconductive, and/or insulative. Examples for second material 32 are silicon dioxide, silicon nitride, amorphous silicon, and polysilicon. In one embodiment, first material 40 and second material 32 are of different composition, and in an alternate embodiment are of the same composition.

Figure 9:
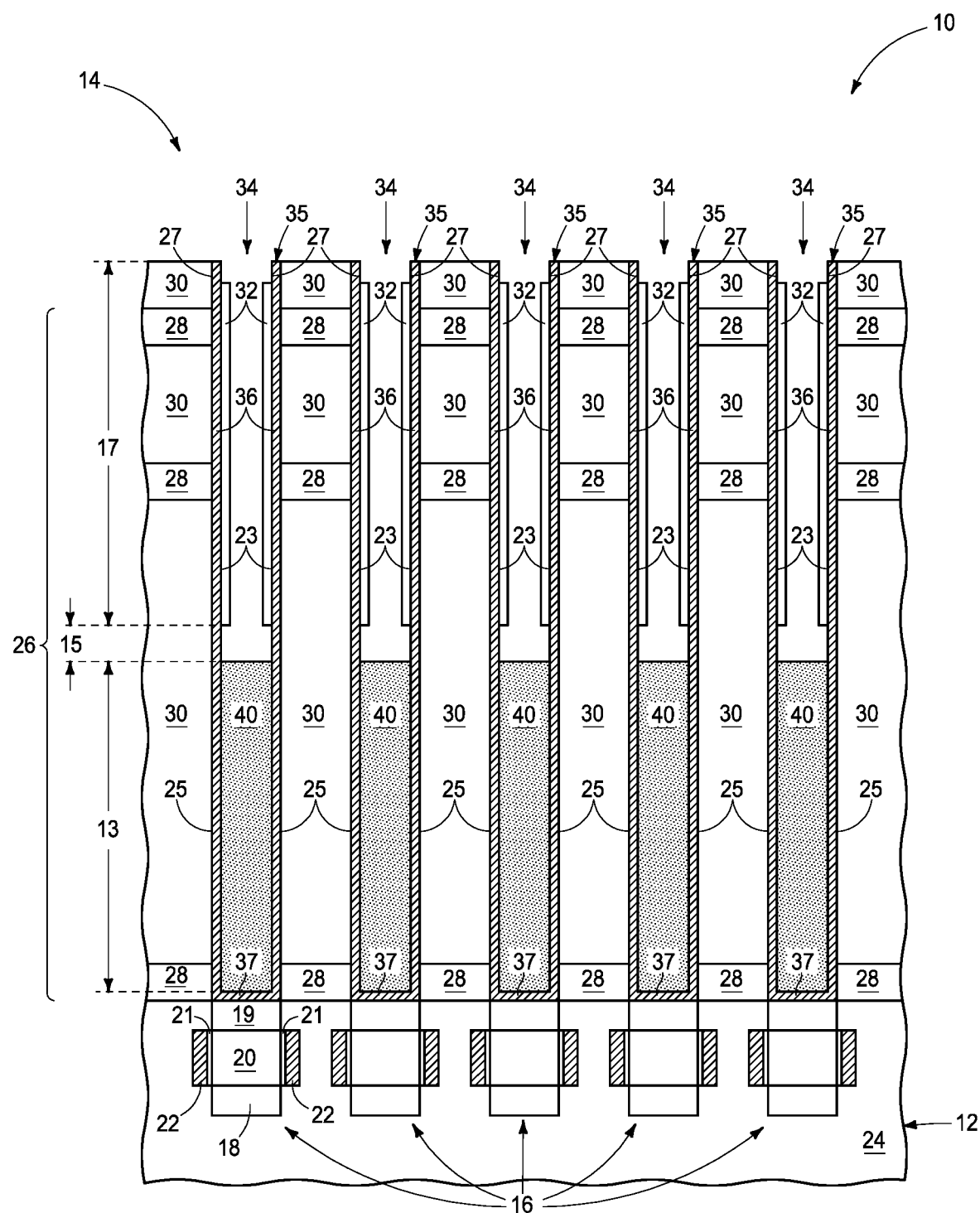
FIG. 9 is a view of the FIG. 8 construction at a processing step subsequent to that shown by FIG. 8.

Referring to FIG. 9, etching has been conducted through laterally extending bottom 33 (no longer shown) and partially into first material 40, thus exposing elevational mid-portion 15 of laterally-internal sides 23 of individual conductive linings 35. An example anisotropic etching chemistry where material 40 comprises photoresist and lining material 32 comprises either silicon dioxide or silicon nitride is either $CHF_3$/Ar or $SF_6$/Ar. Such is but one example method of masking laterally-internal sides 23 of sidewalls 36 of individual upper portions 17 of individual conductive linings 35. Other existing or yet-to-be-developed techniques may be used.

Figure 10:
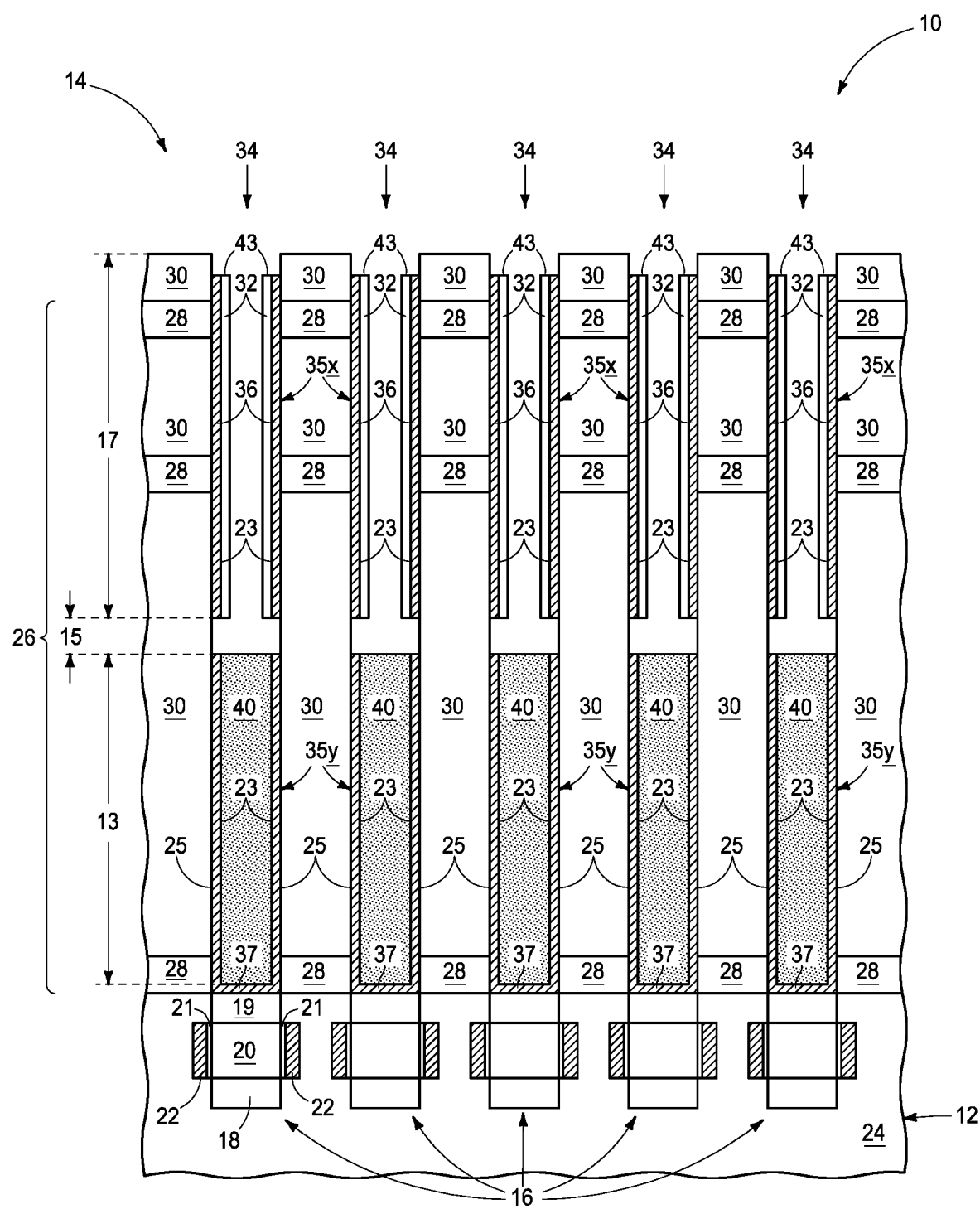
FIG. 10 is a view of the FIG. 9 construction at a processing step subsequent to that shown by FIG. 9.

Referring to FIG. 10, elevational mid-portion 15 of individual conductive linings 35 (not numerically designated in FIG. 10) has been removed. In one embodiment and as shown, an uppermost portion of individual conductive linings 35 has also been removed when removing elevational mid-portion 15. An example technique for such removing includes anisotropic etching of the material of conductive linings 35, for example using an etching chemistry of $Cl_2$ and an inert gas, $Cl_2$ and HBr, or $CHF_3$ and an inert gas where the material of conductive linings 35 comprises TiN. The removing of elevational mid-portion 15 of the individual conductive linings 35 forms an upper capacitor electrode lining 35x (which in one embodiment is upwardly open) having a top 43 and forms a lower capacitor electrode lining 35y (which in one embodiment is upwardly open) that are elevationally separate and spaced from one another in individual capacitor openings 34. FIG. 10 shows an example embodiment where etching of the mid-portions of conductive linings 35 has stopped elevationally coincident with the lower surface of lining 32 for upper capacitor electrode lining 35x and has stopped elevationally coincident with the upper surface of first material 40 for lower capacitor electrode linings 35y (e.g., the etching of the material of linings 35 has been perfectly anisotropic). Alternately by way of example only, the conductive material of conductive linings 35x and 35y might be recessed (not shown) upwardly and downwardly, respectively, with respect to the lower and upper surfaces of materials 32 and 40, respectively. In one embodiment, the forming of the conductive lining (FIGS. 5 and 6), the upper capacitor electrode lining (FIG. 10), and the lower capacitor electrode lining (FIG. 10) forms each to be totally encircling (i.e., circumferentially continuous) in the individual capacitor openings in horizontal cross-section, for example as shown. Alternately, the linings may not each be circumferentially continuous (not shown).

Figure 11:
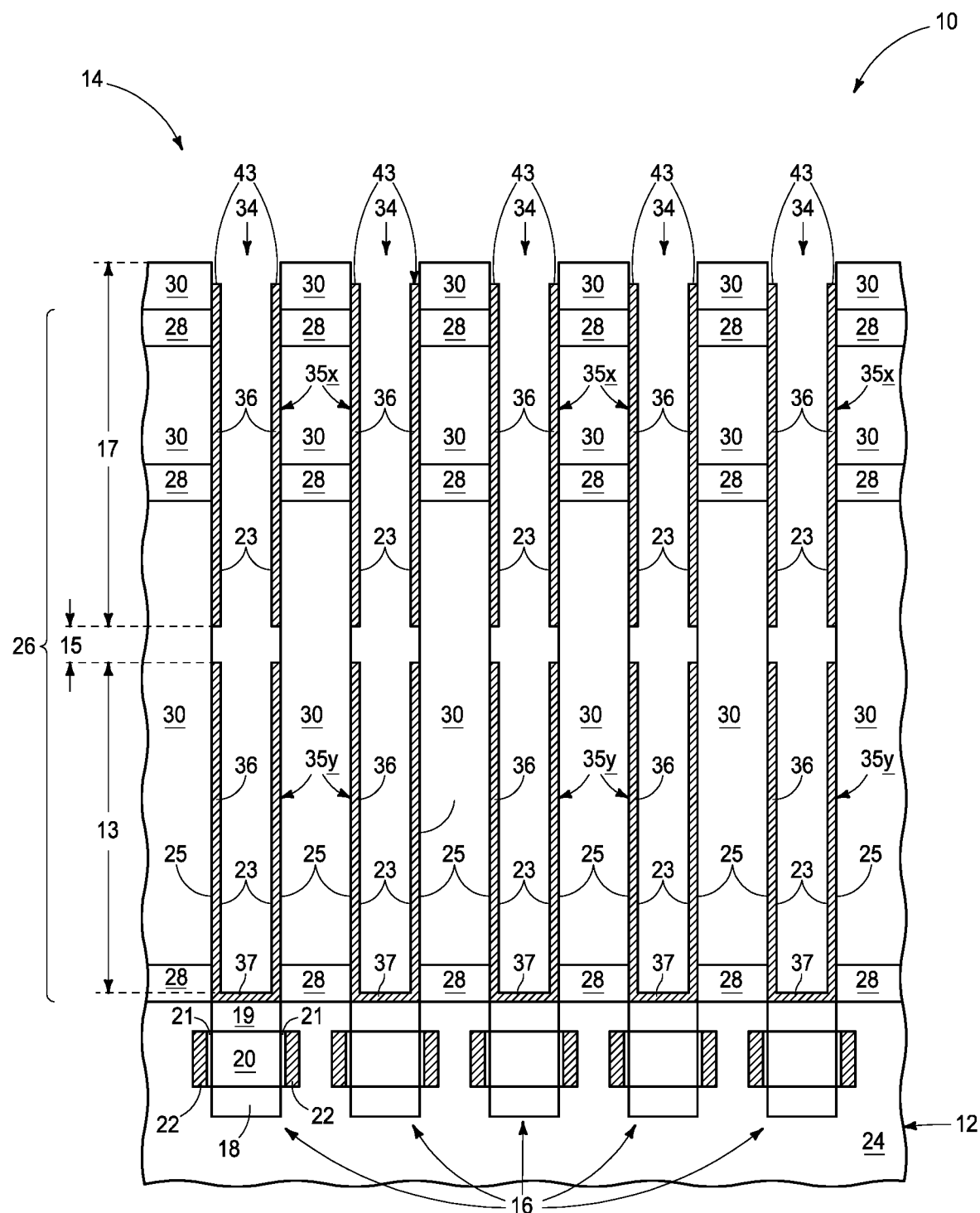
FIG. 11 is a view of the FIG. 10 construction at a processing step subsequent to that shown by FIG. 10.

Referring to FIG. 11, first material 40 and second material 32 (not shown) have been removed from the substrate, for example by any suitable isotropic etching using one or more suitable etching chemistries. For example where the first material comprises photoresist, plasma $O_2$ can be used to remove it. Where the second material comprises silicon nitride or silicon dioxide, aqueous $H_3PO_4$ and aqueous HF, respectively, may be used to remove the second material.

Figure 12:
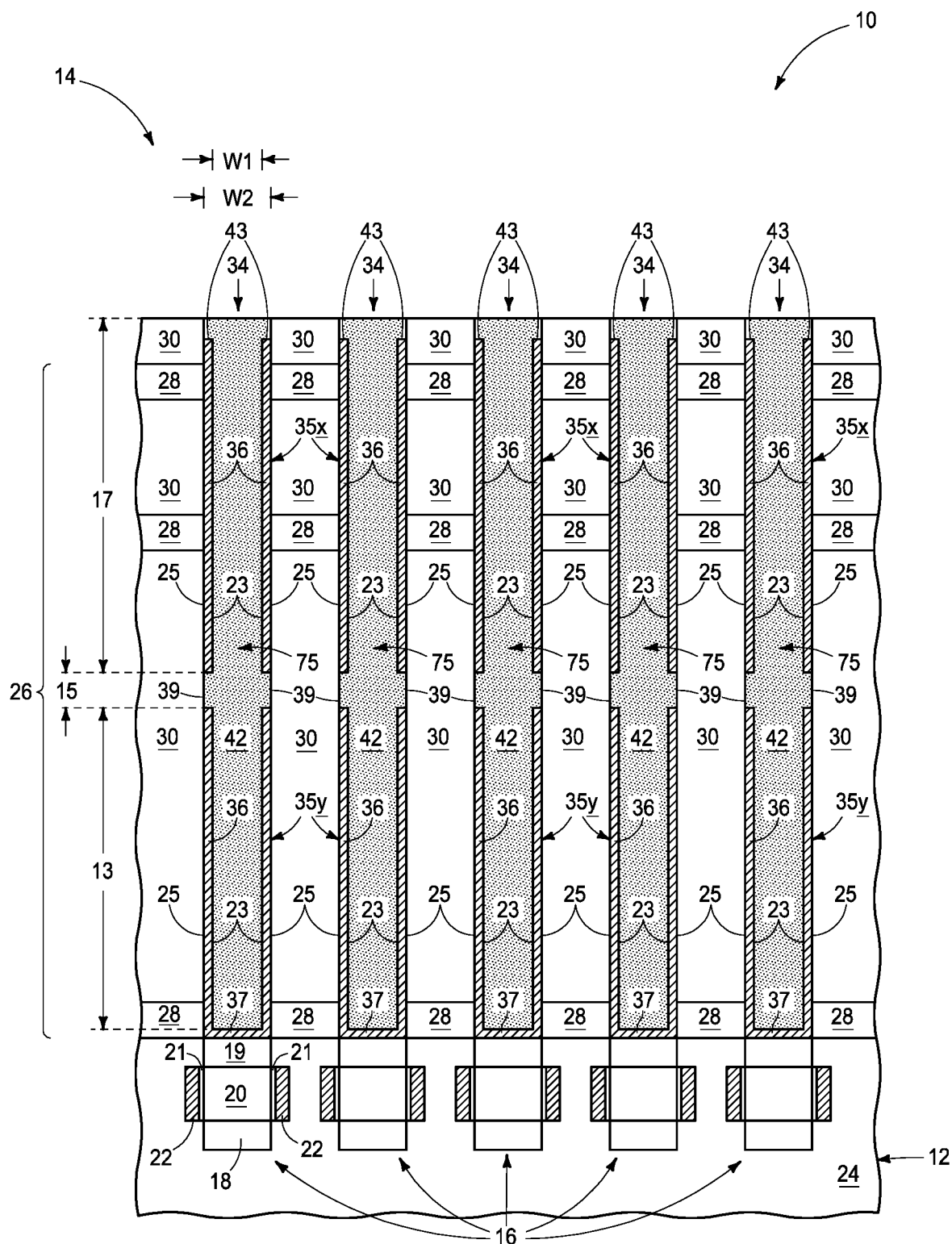
FIG. 12 is a view of the FIG. 11 construction at a processing step subsequent to that shown by FIG. 11.

Referring to FIG. 12, and in one embodiment, at least a majority of the length of individual capacitor electrode openings 34 has been filled with insulative material 42. Example materials include any dielectric, for example doped or undoped silicon dioxide and/or silicon nitride. The depicted construction may be formed by over-filling capacitor openings 34 following by polish back at least to an elevationally outermost surface of support material 26. In one embodiment, insulative material 42 comprises a pillar 75. In one embodiment, pillar 75 is formed to be, from side-to-side, entirely solid from top to bottom in horizontal cross-section (i.e., such includes no hollow central or other hollow portion and/or are not of a container-like shape), for example as shown.

In one embodiment and as shown, insulative material 42 has been formed elevationally between upper capacitor electrode 35x and lower capacitor 35y (e.g., across individual capacitor openings 34 and within former mid-portion 15 of conductive lining 35). Insulative material 42 may be considered as comprising laterally-outermost sides 39. In one embodiment and as shown, insulative material 42 has been formed to be laterally wider (e.g., W2) elevationally between upper capacitor electrode lining 35x and lower capacitor electrode lining 35y than within such upper and lower capacitor electrode linings (e.g., W1) in vertical cross-section (e.g., the vertical cross-section shown by FIG. 12). In one embodiment and as shown, insulative material 42 that is elevationally between the upper and lower electrode linings does not extend laterally outward beyond laterally-outer sides 25 of upper capacitor electrode lining 35x and lower capacitor electrode lining 35y in the vertical cross-section. In one embodiment and as shown, insulative material 42 that is elevationally between the upper and lower capacitor electrode linings and laterally-outer sides 25 of the upper and lower capacitor electrode linings are formed to have laterally-outermost coincident surfaces in the vertical cross-section.

Figure 13:
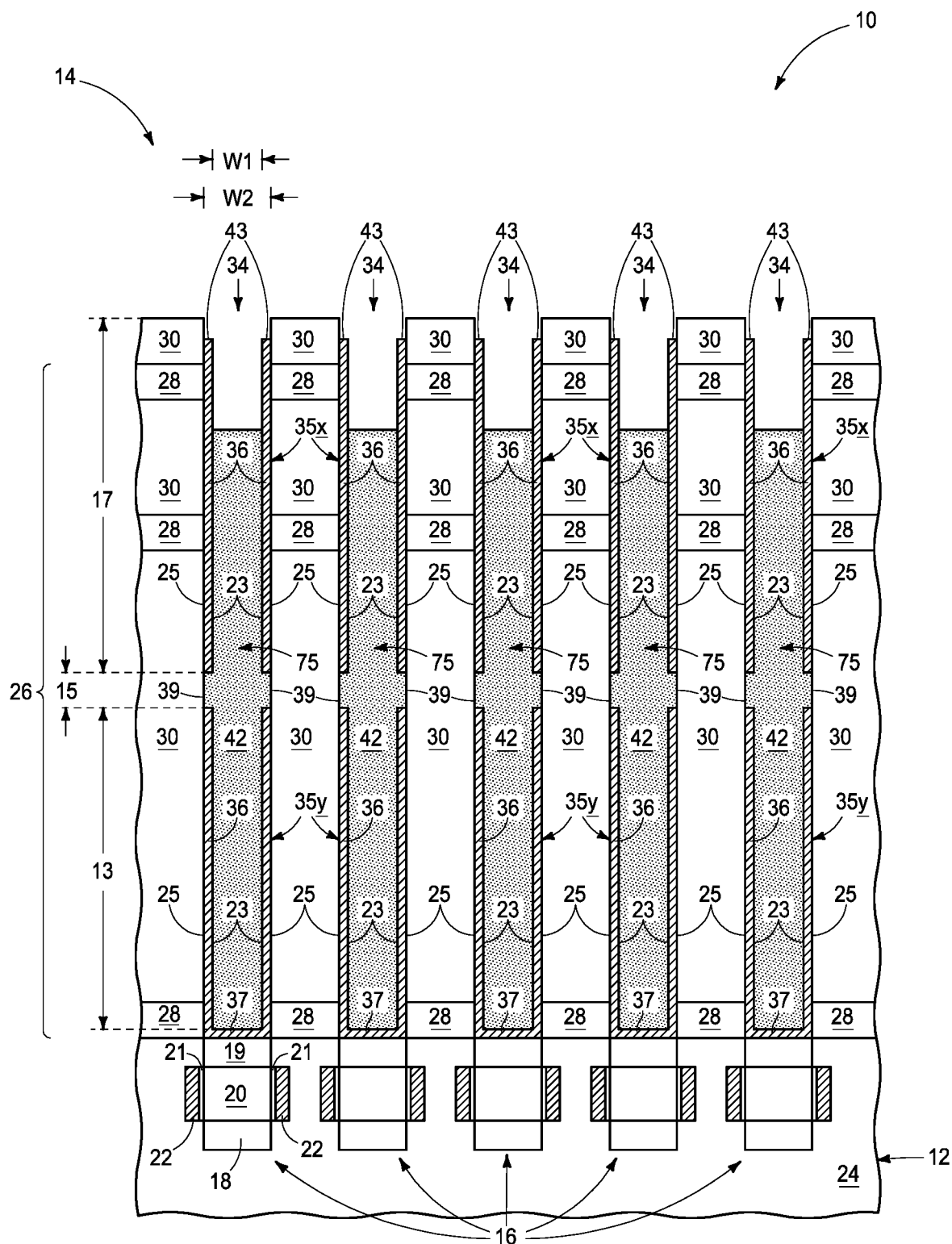
FIG. 13 is a view of the FIG. 12 construction at a processing step subsequent to that shown by FIG. 12.

Referring to FIG. 13, and in one embodiment, insulative material 42 has been elevationally recessed (e.g., by 250 to 1000 Angstroms) relative to uppermost surface of support material 26. Accordingly, and in one embodiment, all of the individual capacitor electrode openings having the upper and lower electrode linings therein is initially filled with the insulative material, followed by removing an uppermost portion of the insulative material from within the individual capacitor openings.

Figure 14:
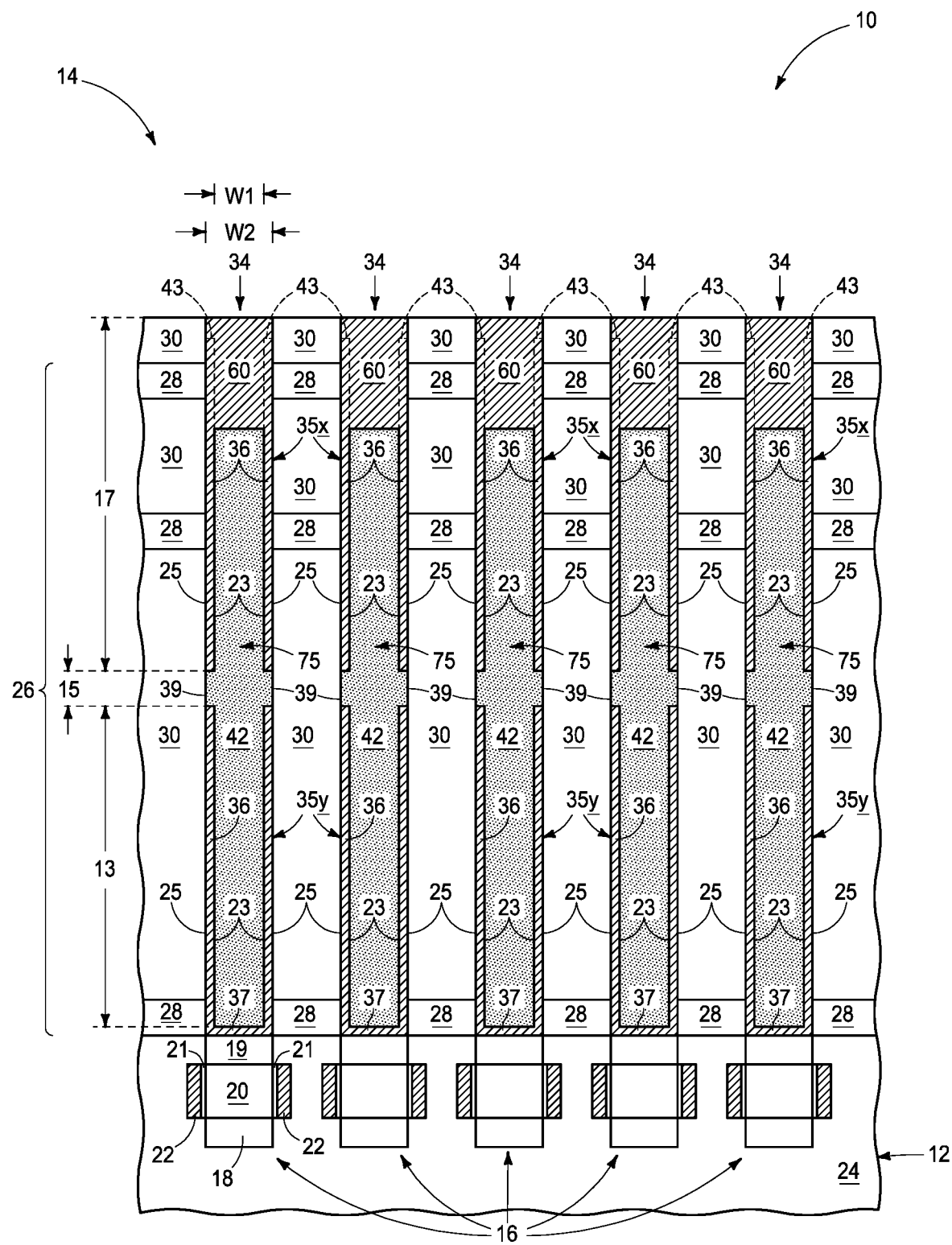
FIG. 14 is a view of the FIG. 13 construction at a processing step subsequent to that shown by FIG. 13.

Referring to FIG. 14, conductive material has been deposited within the elevational recesses formed in FIG. 13, followed by planarizing such back at least to uppermost surfaces of support material 26, thus forming a conductive material top 60. The conductive material may be of the same composition (as shown) or different composition (not shown) as that of conductive material of conductive lining 35 and resultant upper capacitor electrode linings 35x, 35y. Such is but one example technique of forming a conductive material top 60 directly against tops 43 of individual upper capacitor electrode linings 35x. Conductive material top 60 extends laterally from side-to-side across individual upper conductive electrode linings 35x in vertical cross-section in individual capacitor electrode openings 34. Such results, in one example embodiment, in upper conductive electrode lining 35x/60 comprising a downwardly-facing container shape comprising sidewalls 36 and a top 60 extending laterally to and between sidewalls 36.

Figure 15:
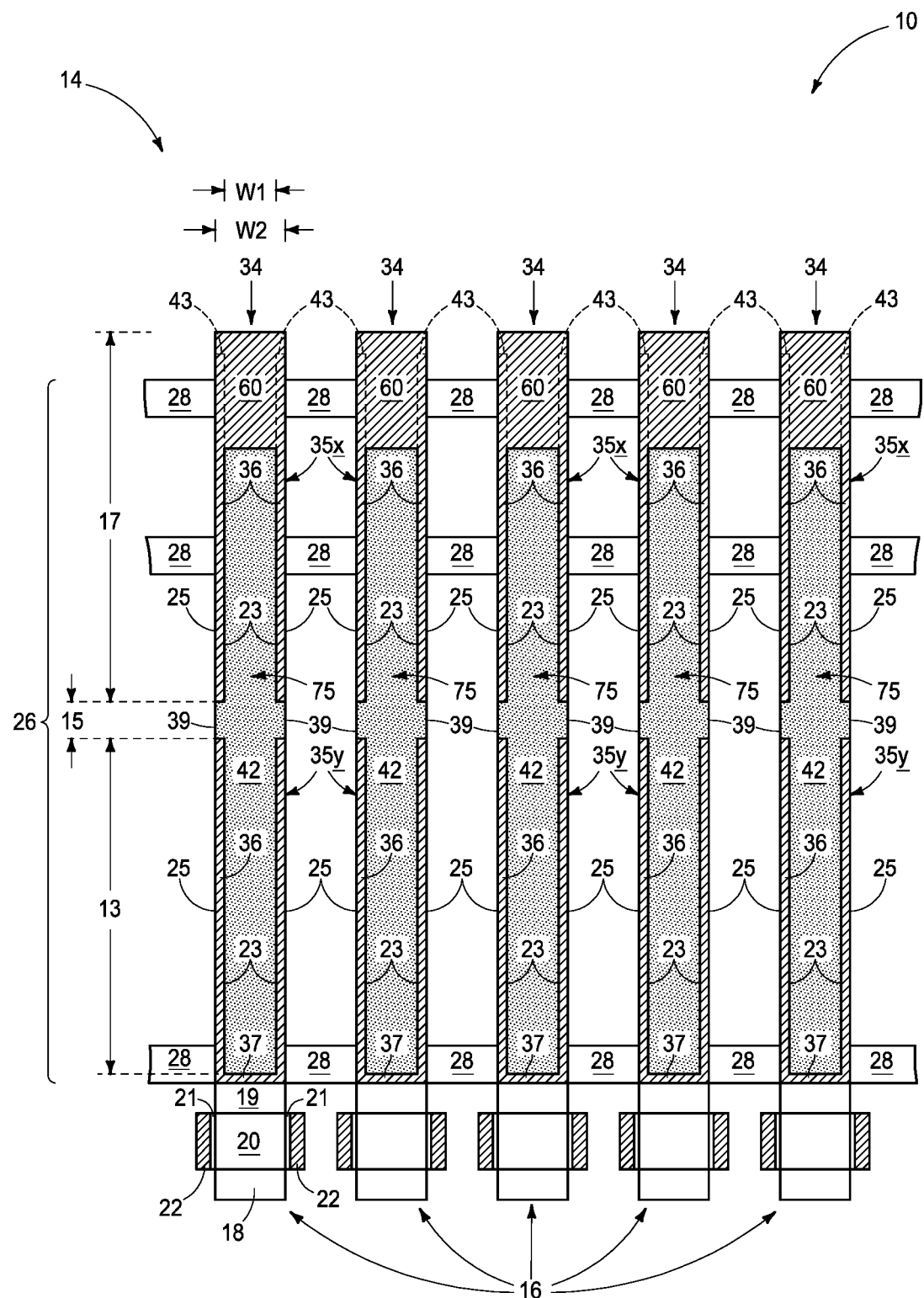
FIG. 15 is a view of the FIG. 14 construction at a processing step subsequent to that shown by FIG. 14.

Referring to FIG. 15, at least some of support material 26 has been removed to expose laterally-outer sides 25 of upper capacitor electrode linings 35x and of lower capacitor electrode linings 35y. In one embodiment and as shown, material 30 (not shown) of support material 26 has been removed selectively relative to material 28 and material of linings 35x and 35y, for example by isotropic wet etching. In this document, a selective etch or removal is an etch or removal where one material is removed relative to another stated material at a rate of at least 2.0:1. Where material 28 and materials of 35x and 35y comprise nitrides, aqueous HF etching chemistry is but one example. In the illustrated example, material 28 will remain as part of the finished circuitry construction, and may provide lateral support to facilitate retaining the capacitor electrode lining 35x and 35y in upright orientation (at least during subsequent processing). Accordingly, and in one embodiment, the processing shown by FIG. 15 depicts but one example wherein only some of support material 26 in which conductive linings 35 were formed is removed.

Figure 16:
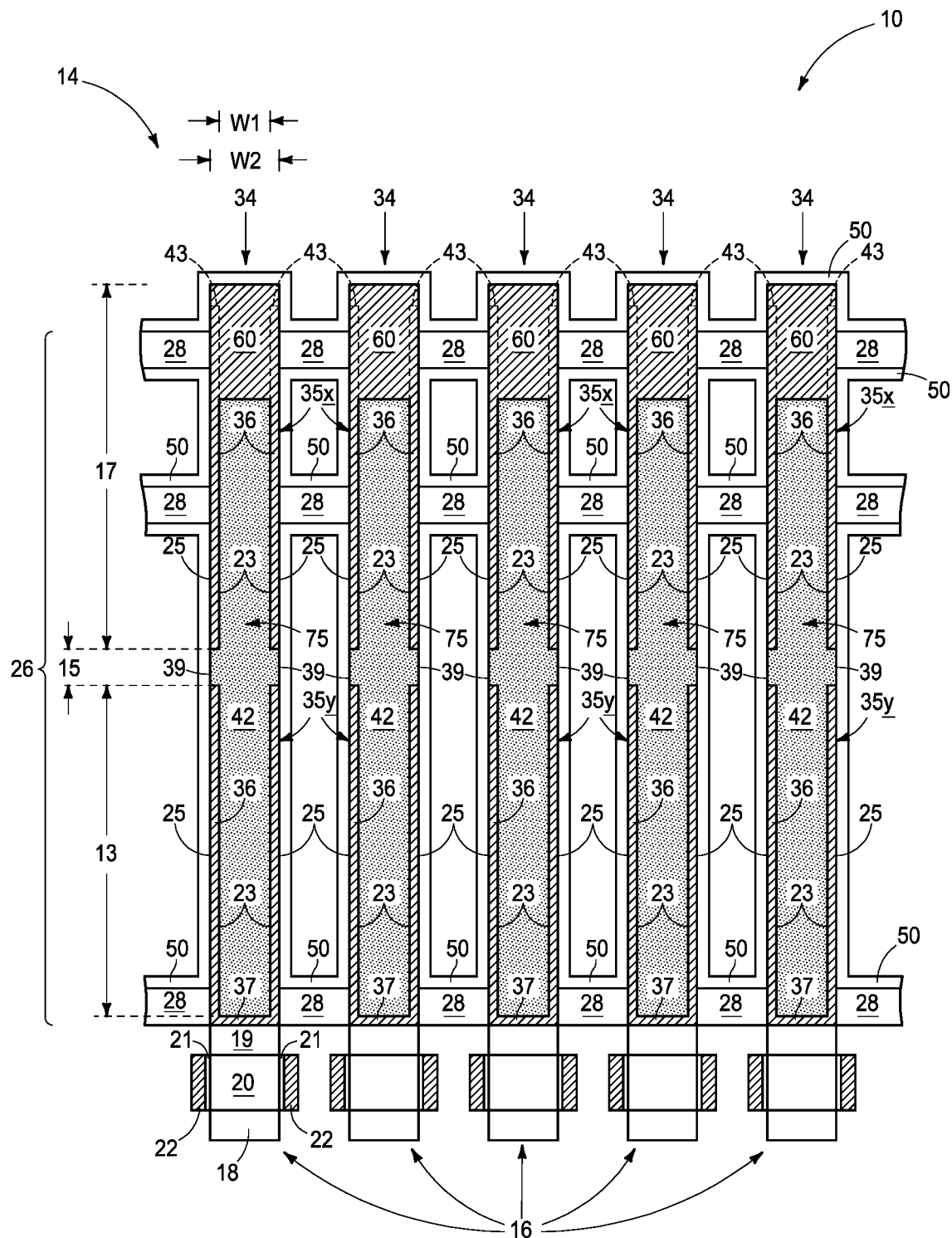
FIG. 16 is a view of the FIG. 15 construction at a processing step subsequent to that shown by FIG. 15.

Referring to FIG. 16, capacitor insulator 50 has been formed laterally outward of upper capacitor electrode linings 35x and lower capacitor electrode linings 35y. In one example embodiment, capacitor insulator 50 comprises programmable material such that the capacitors that will be formed are non-volatile and programmable into at least two different magnitude capacitive states (e.g., whereby the programmable material is both sufficiently thick and remains insulative in the different states such that a current sufficient to erase a stored state does not flow there-through at operating voltages). Example such programmable materials include ferroelectric materials, conductive bridging RAM (CBRAM) materials, phase change materials, and resistive RAM (RRAM) materials, with ferroelectrics believed to be ideal. Example ferroelectric materials include ferroelectrics that have one or more of transition metal oxide, zirconium, zirconium oxide, niobium, niobium oxide, hafnium, hafnium oxide, lead zirconium titanate, and barium strontium titanate, and may have dopant therein which comprises one or more of silicon, aluminum, lanthanum, yttrium, erbium, calcium, magnesium, strontium, and a rare-earth element. In one embodiment, capacitor insulator 50 comprises dielectric material such that the capacitors are volatile. For example, such can comprise one or more of non-programmable dielectric materials such as silicon dioxide, silicon nitride, aluminum oxide, high-k dielectrics, etc. whereby no charge is retained in material 50 upon removal or sufficient reduction of voltage/potential from one or both of two capacitor electrodes of the capacitor. Non-volatile programmable capacitors may have a capacitor insulator that has a suitable combination of programmable material(s) and non-programmable material(s). Regardless, an example thickness for capacitor insulator 50 is 30 to 100 Angstroms.

Figure 17:
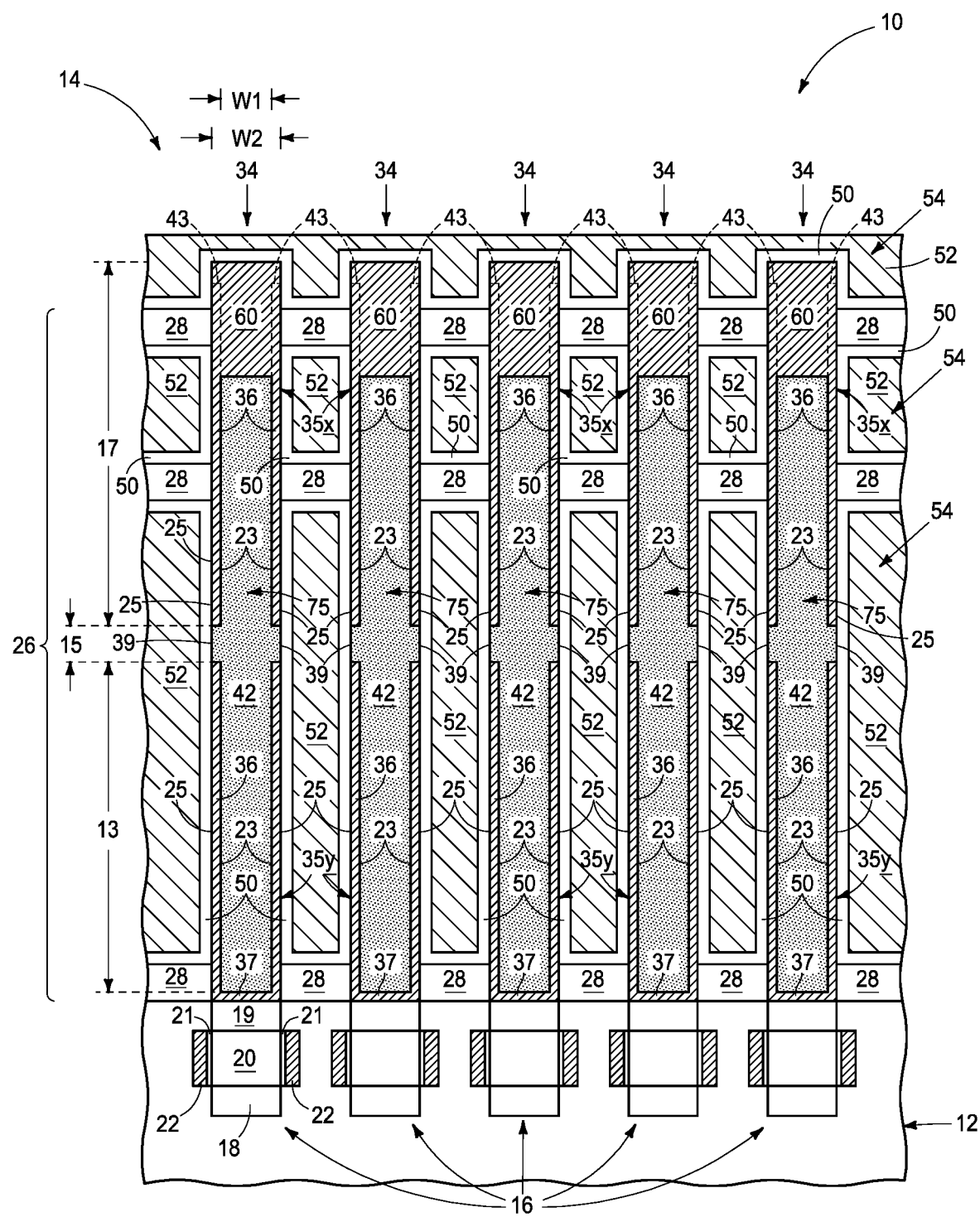
FIG. 17 is a view of the FIG. 16 construction at a processing step subsequent to that shown by FIG. 16.

Referring to FIG. 17, conductive material 52 has been formed laterally outward of capacitor insulator 50.

Figure 18:
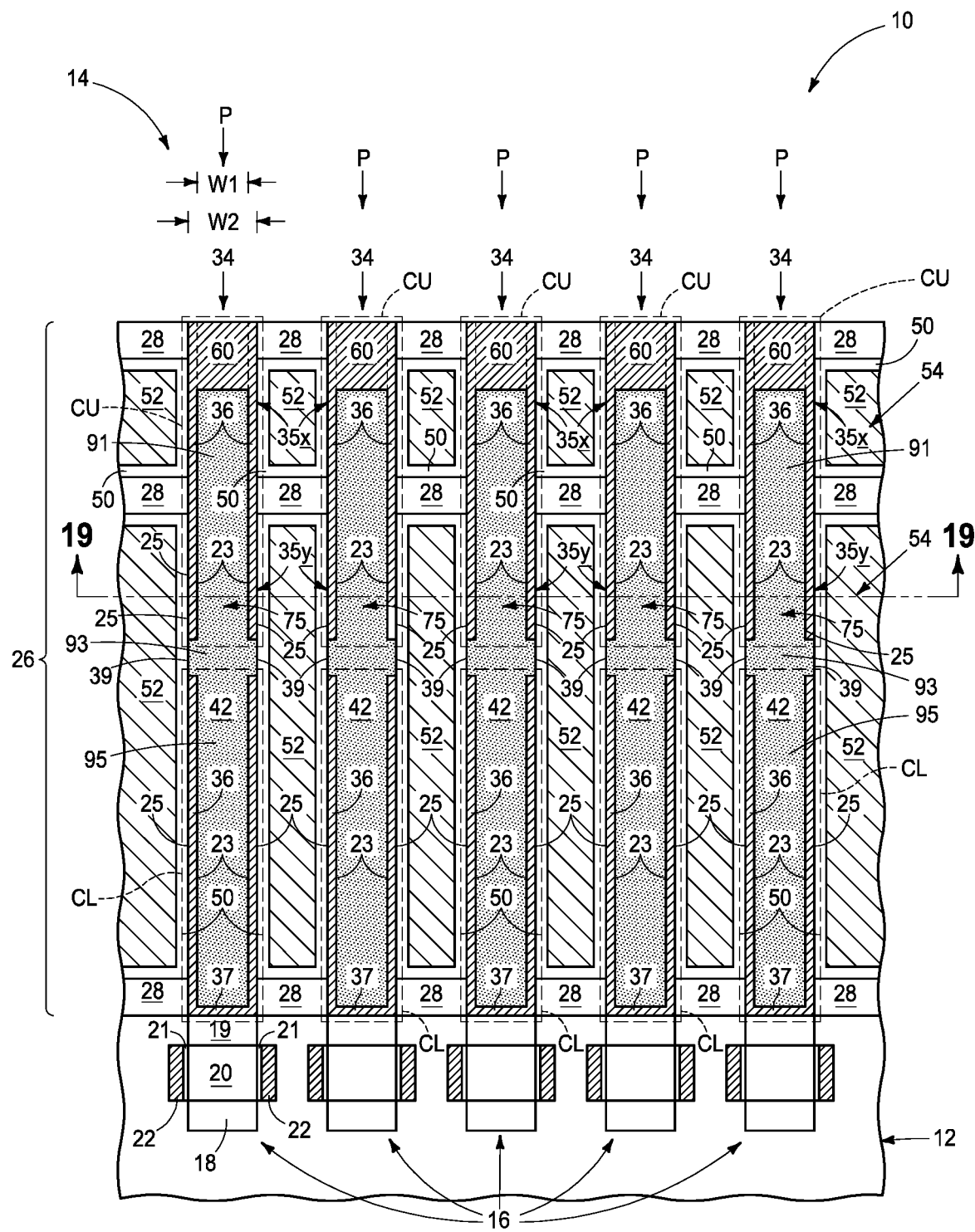
FIG. 18 is a view of the FIG. 17 construction at a processing step subsequent to that shown by FIG. 17, and is taken through line 18-18 in FIG. 19.
Figure 19:
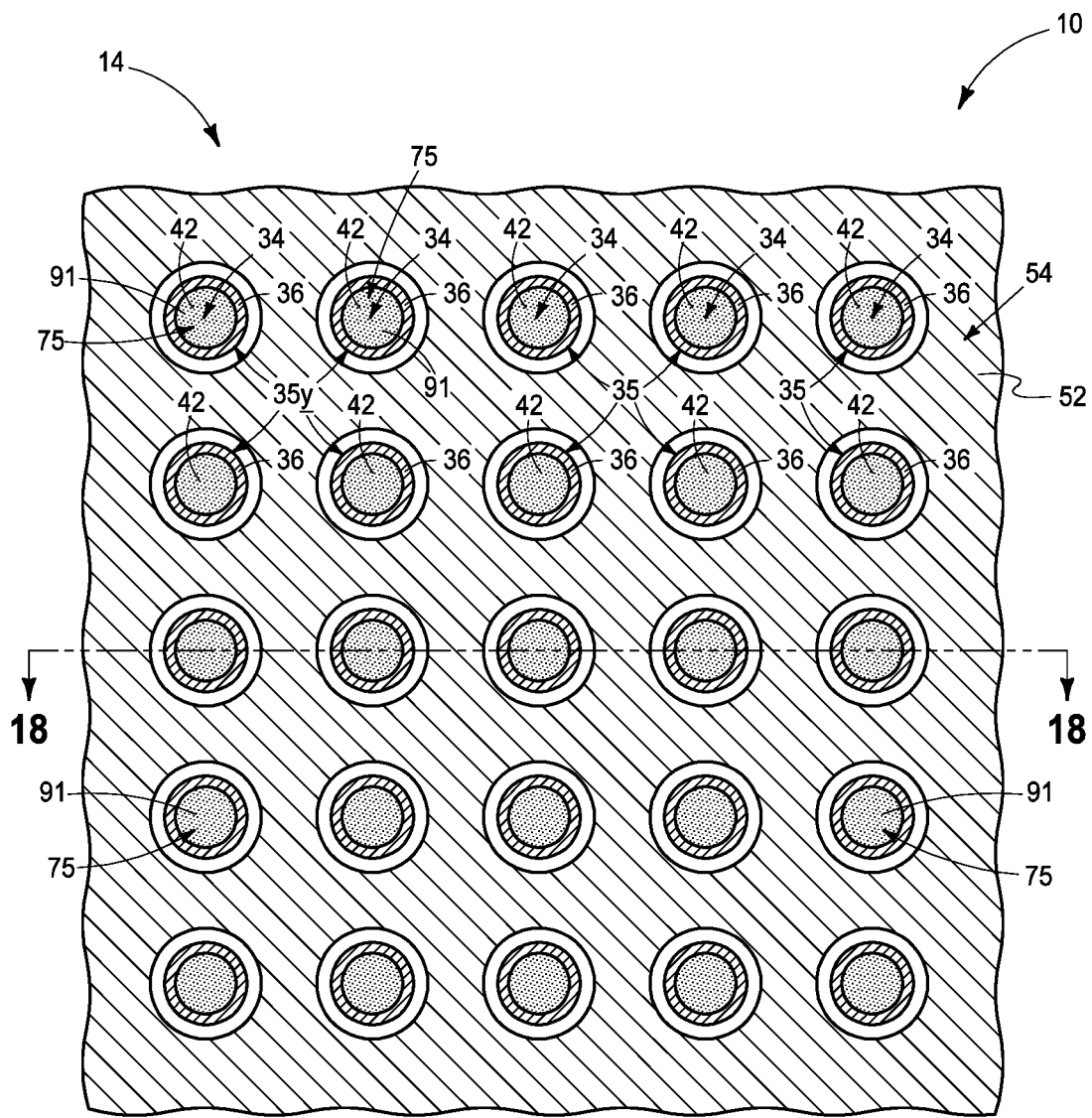
FIG. 19 is a cross-sectional view taken through line 19-19 in FIG. 18.

Referring to FIGS. 18 and 19, and in one embodiment, construction 10 has been planarized back at least to an uppermost portion of support material 26 (e.g., to insulative material 28) as shown. Such has exposed elevationally outer surfaces of tops 60 and forms conductive material 52 to comprise a shared capacitor electrode 54 that is shared by vertically opposed capacitors in individual of the pairs of vertically opposed capacitors. For example and as shown in an ideal embodiment, upper capacitor electrode lining 35x, capacitor insulator 50, and shared capacitor electrode 54 comprise one capacitor (e.g., an upper capacitor CU), and lower capacitor electrode lining 35y, capacitor insulator 50, and shared capacitor electrode 54 comprise the other capacitor (e.g., a lower capacitor CL) of individual pairs "P" of two vertically opposed capacitors (e.g., CU and CL). In one embodiment and as shown, shared capacitor electrode 54 is also shared by multiple pairs P of vertically opposed capacitors CU and CL within array 14. Conductive material 52 of shared capacitor electrode 54 may be of the same or different composition as that of the conductive material of electrode linings 35x and 35y.

Figure 20:
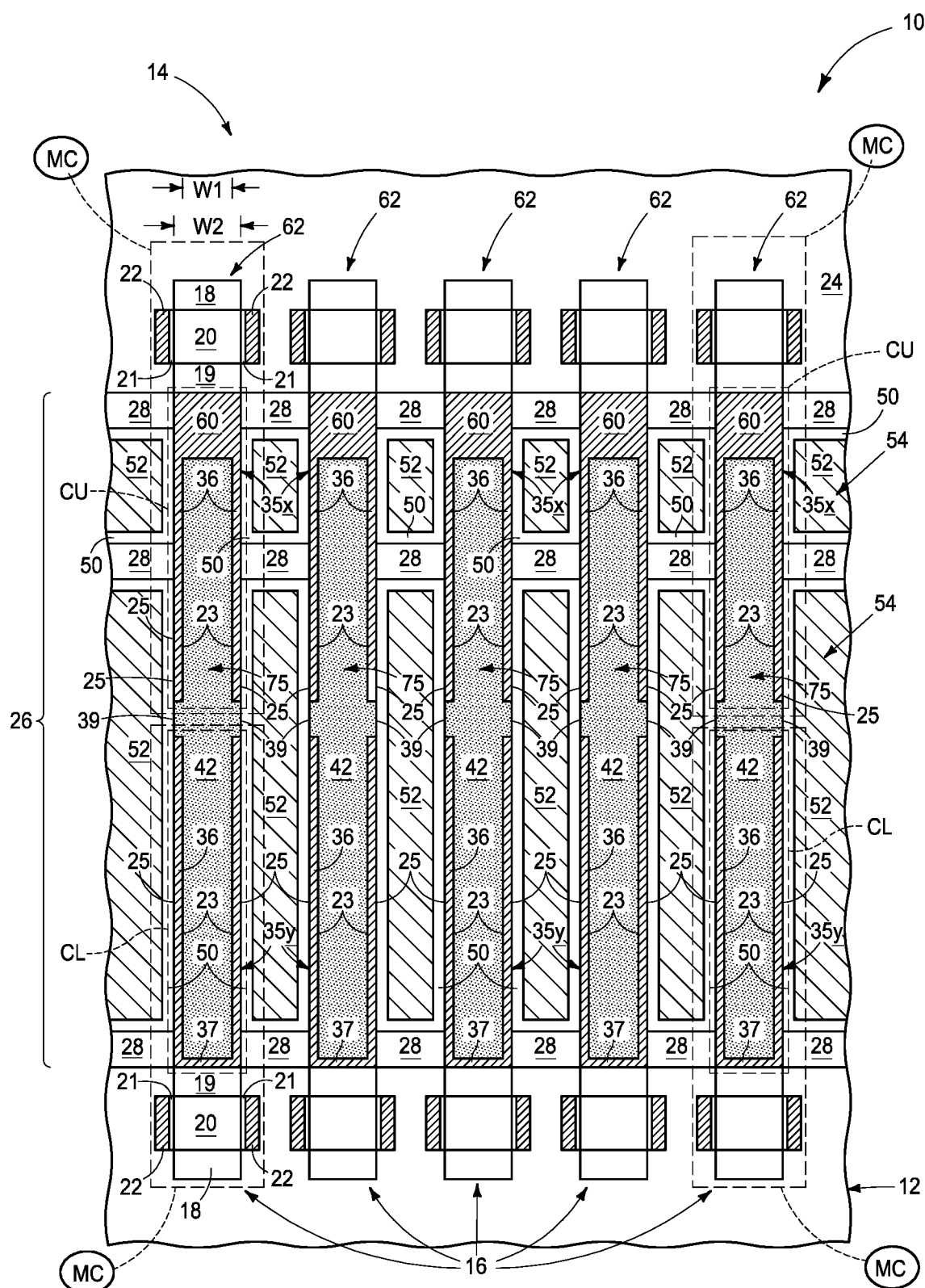
FIG. 20 is a view of the FIG. 18 construction at a processing step subsequent to that shown by FIG. 18.

In one embodiment, vertically opposed capacitors CU and CL are formed to individually comprise an individual memory cell of memory circuitry. For example and by way of example only, FIG. 20 shows subsequent processing wherein transistors 62 have been formed of like construction to that of transistors 16. In some embodiments, transistors 62 are referred to as upper transistors. Inner source/drain regions 18 thereof electrically couple (e.g., directly) to individual capacitors CU through tops 60. Individual memory cells MC may be formed, for example which may comprise a one-transistor and one-capacitor (e.g., a 1T-1C) memory cell and which may be volatile or non-volatile depending on composition of the capacitor insulator. Alternately by way of example, individual memory cells may be formed to comprise a two-transistor and two-capacitor (e.g., a 2T-2C) memory cell and which may be volatile or non-volatile depending on composition of the capacitor insulator, for example as further described below. Other memory cells may be fabricated, and/or including integrated circuitry comprising an array of vertically opposed pairs of capacitors that are not of memory circuitry.

Embodiments of the invention also encompass an array comprising pairs of vertically opposed capacitors independent of method of manufacture. However, an array comprising pairs of vertically opposed capacitors may have any of the attribute(s) or aspect(s) as described herein and/or shown. In one embodiment, the pairs (e.g., P) individually comprise an upper capacitor electrode lining (e.g., 35x) and a lower capacitor electrode lining (e.g., 35y) that are elevationally separate and spaced from one another. A shared capacitor electrode (e.g., 54) is provided that is shared by the vertically opposed capacitors (e.g., CU and CL) in individual of the pairs. The shared capacitor electrode is alongside laterally-outer sides (e.g., 25) of the upper and lower capacitor electrode linings. In one embodiment, the shared capacitor electrode is also shared by multiple of the pairs of vertically opposed capacitors. A capacitor insulator (e.g., 50) is between the shared capacitor electrode and the upper and lower capacitor electrode linings. In one embodiment, the capacitor insulator comprises programmable material (e.g., ferroelectric material) such that the capacitors are non-volatile and programmable into at least two different magnitude capacitive states. In one embodiment, the capacitor insulator comprises dielectric material such that the capacitors are volatile. In one embodiment, the upper capacitor electrode lining comprises a downwardly-facing container shape comprising sidewalls (e.g., 36) and a top (e.g., 60) extending laterally to and between the sidewalls of the lower capacitor electrode lining. In one embodiment, the lower capacitor electrode lining comprises an upwardly-facing container shape comprising sidewalls (e.g., 36) and a bottom (e.g., 37) extending laterally to and between the sidewalls of the lower capacitor electrode lining. In one embodiment, a dielectric pillar (e.g., 75) extends elevationally within and elevationally between each of the upper and lower capacitor electrode linings. In one such embodiment, the pillar is laterally wider (e.g., W2) elevationally between than within (e.g., W1) the upper and lower capacitor electrode linings in vertical cross-section. In one embodiment, the upper capacitor electrode lining and the lower capacitor electrode lining are totally encircling in the individual capacitor openings in horizontal cross-section. Any other attribute(s) or aspect(s) as described herein and/or shown may be used.

In one embodiment, an array comprises pairs (e.g., P) of vertically opposed capacitors (e.g., CU and CL), with such pairs individually comprising an upper capacitor electrode lining (e.g., 35x) and a lower capacitor electrode lining (e.g., 35y) that are elevationally separate and spaced from one another. The upper capacitor electrode lining defines an upper void space (e.g., 91, FIGS. 18, 19) laterally between sidewalls (e.g., 36) of the upper capacitor electrode lining in vertical cross-section. The lower capacitor electrode lining defines a lower void space (e.g., 95) laterally between sidewalls (e.g., 36) of the lower capacitor electrode lining in the vertical cross-section. A mid-void space (e.g., 93) is elevationally between the upper and lower capacitor electrode linings in the vertical cross-section. Insulative material (e.g., 42) fills all of the upper, lower, and mid-void spaces. A shared capacitor electrode (e.g., 54) is shared by the vertically opposed capacitors in individual of the pairs. The shared capacitor electrode is alongside laterally-outer sides (e.g., 25) of the upper and lower capacitor electrode linings. A capacitor insulator (e.g., 50) is between the shared capacitor electrode and the upper and lower capacitor electrode linings. In one embodiment, the insulative material is laterally wider (e.g., W2) in the mid-void space than within the upper and lower void spaces (e.g., W1) in the vertical cross-section. In one embodiment, the insulative material that is in the mid-void space does not extend laterally outward beyond laterally-outer sides of the upper and lower capacitor electrode linings in the vertical cross-section. In one embodiment, the insulative material that is in the mid-void space and laterally-outer sides of the upper and lower capacitor electrode linings have laterally-outermost coincident surfaces in the vertical cross-section. Any other attribute(s) or aspect(s) as described herein and/or shown may be used.

In one embodiment, a memory array comprises pairs of vertically opposed capacitors. The pairs individually comprise an upper capacitor electrode lining and a lower capacitor electrode lining that are elevationally separate and spaced from one another. The capacitors in individual of the pairs individually are in two different memory cells of the memory array (e.g., as shown in FIG. 20). A shared capacitor electrode is shared by the vertically opposed capacitors in individual of the pairs. The shared capacitor electrode is alongside laterally-outer sides of the upper and lower capacitor electrode linings. A capacitor insulator is between the shared capacitor electrode and the upper and lower capacitor electrode linings. Upper transistors (e.g., 62) are individually elevationally outward of and electrically coupled (in one embodiment directly electrically coupled) to one of the upper capacitor electrode linings to comprise one 1T-1C memory cell of the array (e.g., as shown in FIG. 20). Lower transistors are individually elevationally inward of and electrically coupled (in one embodiment directly electrically coupled) to one of the lower capacitor electrode linings to comprise another 1T-1C memory cell of the array. In one embodiment, the lower transistors extend elevationally (in one embodiment vertically), and in one embodiment the upper transistors extend elevationally (in one embodiment vertically). Any other attribute(s) or aspect(s) as described herein and/or shown may be used.

Figure 21:
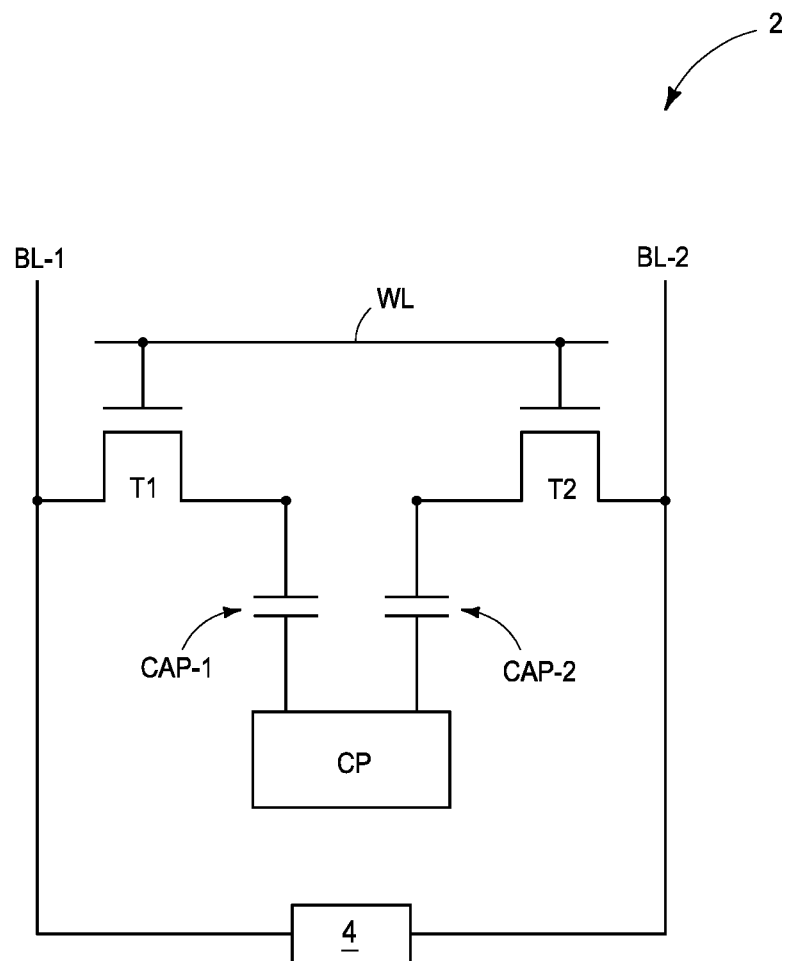
FIG. 21 is a schematic of a two transistor and two capacitor memory cell in accordance with an embodiment of the invention.

In memory arrays, individual memory cells having vertically opposed capacitors may be fabricated in other memory architectures than that shown in FIG. 20, for example in a 2T-2C architecture as is schematically shown in FIG. 21. A 2T-2C memory cell is schematically illustrated in FIG. 21 as a memory cell 2. The two transistors of the memory cell are labeled as T1 and T2, and the two capacitors are labeled as CAP-1 and CAP-2. A source/drain region of first transistor T1 connects with a node of first capacitor (CAP-1), and the other source/drain region of T1 connects with a first comparative bit line (BL-1). A gate of T1 connects with a word line (WL). A source/drain region of second transistor T2 connects with a node of second capacitor (CAP-2), and the other source/drain region of T2 connects with a second comparative bit line BL-2. A gate of T2 connects with word line WL. Each of the first and second capacitors (CAP-1 and CAP-2) has a node electrically coupled with a common plate (CP). The common plate may be coupled with any suitable voltage. Comparative bit lines BL-1 and BL-2 extend to circuitry 4 which compares electrical properties (e.g., voltage) of the two to ascertain a memory state of memory cell 2. An advantage of a 2T-2C memory cell is that a memory state may be ascertained by comparing the electrical properties of the two comparative bit lines BL-1 and BL-2 to one another. Accordingly, a reference bit line associated with other memory (for instance, 1T-1C memory) may be omitted. In such an embodiment, BL-1 and BL-2 may be electrically coupled to the same sense amplifier as part of circuitry 4.

Figure 22:
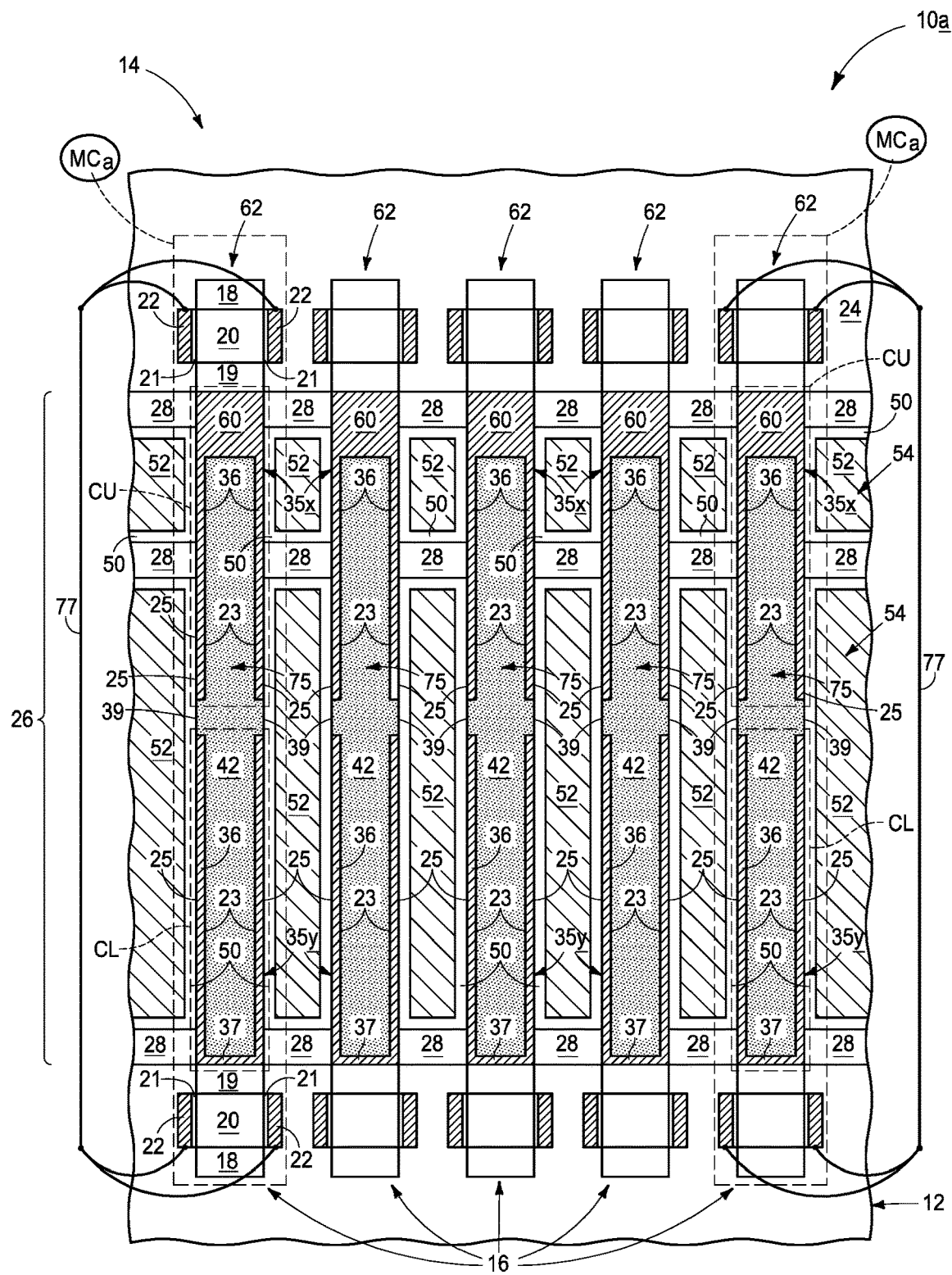
FIG. 22 is a hybrid schematic and diagrammatic cross-sectional view of a 2T/2C construction in accordance with an embodiment of the invention.

An alternate embodiment construction to that of FIG. 20 that may comprise 2T-2C architecture like that shown in FIG. 21 is shown in FIG. 22. Like numerals from the above-described embodiments have been used where appropriate, with some construction differences being indicated with the suffix "a" or different numerals. Construction 10*a* comprises a memory array comprises pairs of vertically opposed capacitors CU and CL, with the pairs of vertically opposed capacitors individually comprising an upper capacitor electrode lining 35*x* and a lower capacitor electrode lining 35*y* that are elevationally separate and spaced from one another. The pairs of upper and lower capacitors (CU and CL) are in a same individual 2T-2C memory cell MC$_a$ of the memory array. Shared capacitor electrode 54 is shared by the vertically opposed capacitors in individual of the pairs, with shared capacitor electrode 54 being alongside laterally-outer sides 25 of upper and lower capacitor electrode linings 35*x*, 35*y*, respectively. Capacitor insulator 50 is between the shared capacitor electrode and the upper and lower capacitor electrode linings. Upper transistors 62 are individually elevationally outward of and electrically coupled (in one embodiment directly electrically coupled) to one of the upper capacitor electrode linings. Lower transistors 16 are individually elevationally inward of and electrically coupled (in one embodiment directly electrically coupled) to one of the lower capacitor electrode linings. Pairs of one of the upper transistors and one of the lower transistors have their respective gates directly electrically coupled together to comprise the individual 2T-2C memory cells MC$_a$ of the memory array. In one embodiment, respective one source/drain regions of the one upper transistor and the one lower transistor (e.g., 18 of upper transistor 62 and 18 of lower transistor 16) in individual of the pairs are electrically coupled to a respective one of two comparative bit lines that are electrically coupled to the same sense amplifier as described above with respect to FIG. 21. Any other attribute(s) or aspect(s) as described herein and/or shown may be used.

Figure 23:
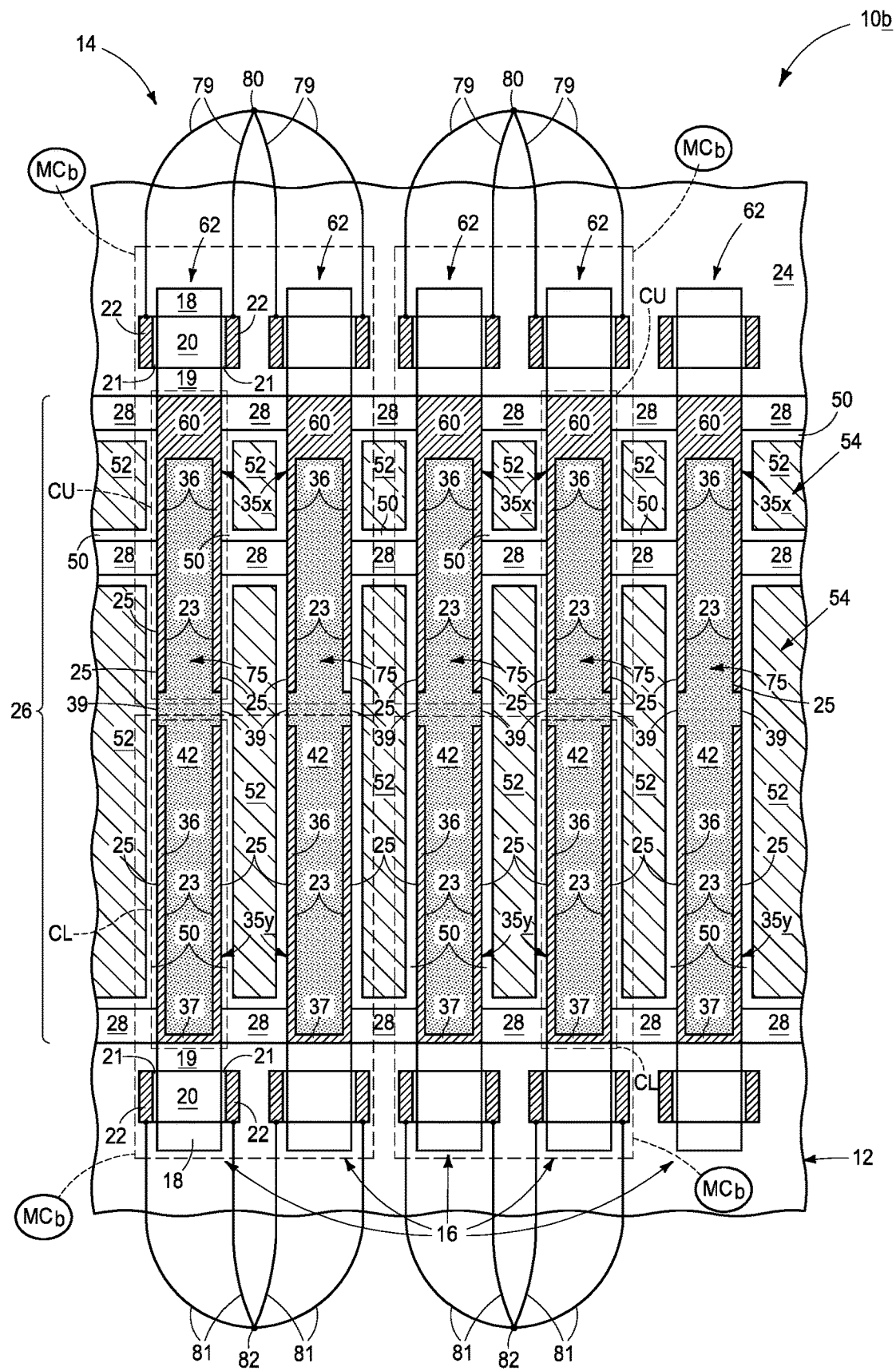
FIG. 23 is a hybrid schematic and diagrammatic cross-sectional view of a 2T/2C construction in accordance with an embodiment of the invention.

An alternate embodiment construction to that of FIG. 22 that may comprise 2T-2C architecture like that shown in FIG. 21 is shown in FIG. 23. Like numerals from the above-described embodiments have been used where appropriate, with some construction differences being indicated with the suffix "b" or different numerals. Construction 10*b* comprises individual memory cells MC$_b$ of 2T-2C architecture and which may be volatile or non-volatile depending on composition of the capacitor insulator. Construction 10*b* comprises a memory array having pairs of vertically opposed capacitors CU and CL, with the pairs individually comprising upper capacitor electrode lining 35*x* and lower capacitor electrode lining 35*y* that are elevationally separate and spaced from one another. The upper and lower capacitors are in two different memory cells MC$_b$ of the memory array, with shared capacitor electrode 54 being alongside laterally-outer sides 25 of upper and lower capacitor electrode linings 35*x*, 35*y*, respectively. Capacitor insulator 50 is between the shared capacitor electrode and the upper and lower capacitor electrode linings. Upper transistors 62 are individually elevationally outward of and electrically coupled (in one embodiment directly electrically coupled) to one of the upper capacitor electrode linings. Pairs of immediately laterally adjacent of the upper transistors have their respective gates directly electrically coupled together to comprise one 2T-2C memory cell MC$_b$ of the array. Such is shown schematically in FIG. 23 by conductive interconnects 79 extending to a node 80 for the depicted two such individual pairs. Lower transistors 16 are individually elevationally inward of and electrically coupled to one of lower capacitor electrode linings 35*y*. Pairs of immediately laterally adjacent of the lower transistors having their respective gates directly electrically coupled together to comprise another 2T-2C memory cell MC$_b$ of the array. Such is shown schematically in FIG. 23 by conductive interconnects 81 extending to a node 82 for the depicted two such individual pairs. Construction (not shown) for interconnects 81 may be within and/or out of the plane of the page upon which FIG. 23 lies. In one embodiment, respective one source/drain regions of the immediately laterally adjacent of the upper transistors (e.g., source/drain regions 18 of two upper transistors 62 in a single memory cell MC$_b$) are electrically coupled to a respective one of two comparative bit lines that are electrically coupled to the same sense amplifier as described above with respect to FIG. 21. In one embodiment, respective one source/drain regions of the immediately laterally adjacent of the lower transistors (e.g., 18 of lower transistors 16) are electrically coupled to a respective one of two comparative bit lines that are electrically coupled to the same sense amplifier as described above with respect to FIG. 21. Any other attribute(s) or aspect(s) as described herein and/or shown may be used.

Each of the above method and structure embodiments includes what might be considered or termed as a single deck, a single level, or a single tier of pairs of vertically opposed capacitors or horizontally nearby pairs. One of more additional deck(s)/level(s)/tier(s) may be provided above and/or below the described and depicted deck/level/tier. Further, additional circuitry (including perhaps one or more arrays of capacitors not in accordance with the invention) may be fabricated in one or more additional deck(s)/level(s)/tier(s) above and/or below the described and depicted deck/level/tier.

CONCLUSION

In some embodiments, a method of forming an array comprising pairs of vertically opposed capacitors comprises forming a conductive lining in individual capacitor openings in support material. An elevational mid-portion of individual of the conductive linings is removed to form an upper capacitor electrode lining and a lower capacitor electrode lining that are elevationally separate and spaced from one another in the individual capacitor openings. A capacitor insulator is formed laterally outward of the upper and lower capacitor electrode linings. Conductive material is formed laterally outward of the capacitor insulator to comprise a shared capacitor electrode that is shared by vertically opposed capacitors in individual of the pairs of vertically opposed capacitors.

In some embodiments, a method of forming an array comprising pairs of vertically opposed capacitors comprises forming a conductive lining in individual capacitor openings in support material. Laterally-internal sides of sidewalls of individual lower portions of the individual conductive linings are masked. Laterally-internal sides of sidewalls of individual upper portions of the individual conductive linings are masked. An elevational mid-portion of the individual conductive linings that is between the masked upper and lower portions is removed to form an upper capacitor electrode lining and a lower capacitor electrode lining that are elevationally separate and spaced from one another in the individual capacitor openings. After removing the elevational mid-portion, at least some of the support material is removed to expose laterally-outer sides of the sidewalls of the upper and lower capacitor electrode linings. A capacitor insulator is formed laterally outward of the upper and lower capacitor electrode linings. Conductive material is formed laterally outward of the capacitor insulator to comprise a shared capacitor electrode that is shared by vertically opposed capacitors in individual of the pairs of vertically opposed capacitors.

In some embodiments, a method of forming an array comprising pairs of vertically opposed capacitors comprises forming an upwardly-open upper capacitor electrode lining and an upwardly-open lower capacitor electrode lining in individual capacitor openings in support material, with the upper and lower capacitor electrode linings being elevationally separate and spaced from one another in the individual capacitor openings. At least a majority of length of the individual capacitor electrode openings having the upper and lower capacitor electrode linings therein is filled with insulative material. A conductive material top is formed directly against tops of individual of the upper capacitor electrode linings. The conductive material top extends laterally from side-to-side across the individual upper capacitor electrode linings in vertical cross-section in the individual capacitor electrode openings. A capacitor insulator is formed laterally outward of the upper and lower capacitor electrode linings. Conductive material is formed laterally outward of the capacitor insulator to comprise a shared capacitor electrode that is shared by vertically opposed capacitors in individual of the pairs of vertically opposed capacitors.

In some embodiments, a method of forming an array comprising pairs of vertically opposed capacitors comprises forming an upwardly-open conductive lining in individual capacitor openings in support material. A lower portion of the individual capacitor openings is filled with a first material that is over laterally-internal sides of sidewalls of the individual conductive linings. An upper portion of the laterally-internal sides of sidewalls of the individual conductive linings is lined within the individual capacitor openings with a second material. The second material lining less-than-fills remaining volume of the individual capacitor openings laterally between laterally-outer sides of the second material lining in horizontal cross-section. The second material lining comprises a laterally extending bottom covering atop all of the first material in the individual capacitor openings. Etching is conducted through the laterally extending bottom and partially into the first material in the individual capacitor openings to expose an elevational mid-portion of the laterally-internal sides of the individual conductive linings. The exposed elevational mid-portion of the laterally-internal sides of the individual conductive linings are removed to form an upper capacitor electrode lining and a lower capacitor electrode lining that are elevationally separate and spaced from one another in the individual capacitor openings. After removing the elevational mid-portion, at least some of the support material is removed to expose laterally-outer sides of the upper and lower capacitor electrode linings. A capacitor insulator is formed laterally outward of the upper and lower capacitor electrode linings. Conductive material is formed laterally outward of the capacitor insulator to comprise a shared capacitor electrode that is shared by vertically opposed capacitors in individual of the pairs of vertically opposed capacitors.

In some embodiments, an array comprises pairs of vertically opposed capacitors, with the pairs individually comprising an upper capacitor electrode lining and a lower capacitor electrode lining that are elevationally separate and spaced from one another. A shared capacitor electrode is shared by the vertically opposed capacitors in individual of the pairs, with the shared capacitor electrode being alongside laterally-outer sides of the upper and lower capacitor electrode linings. A capacitor insulator is between the shared capacitor electrode and the upper and lower capacitor electrode linings.

In some embodiments, an array comprises pairs of vertically opposed capacitors, with the pairs individually comprising an upper capacitor electrode lining and a lower capacitor electrode lining that are elevationally separate and spaced from one another. The upper capacitor electrode lining defines an upper void space laterally between sidewalls of the upper capacitor electrode lining in vertical cross-section. The lower capacitor electrode lining defines a lower void space laterally between sidewalls of the lower capacitor electrode lining in the vertical cross-section. Mid void space is elevationally between the upper and lower capacitor electrode linings in the vertical cross-section. Insulative material fills all of the upper, lower, and mid void spaces. A shared capacitor electrode is shared by the vertically opposed capacitors in individual of the pairs, with the shared capacitor electrode being alongside laterally-outer sides of the upper and lower capacitor electrode linings. A capacitor insulator is between the shared capacitor electrode and the upper and lower capacitor electrode linings.

In some embodiments, a memory array comprises pairs of vertically opposed capacitors, with the pairs individually comprising an upper capacitor electrode lining and a lower capacitor electrode lining that are elevationally separate and spaced from one another. The capacitors in individual of the pairs individually are in two different memory cells of the memory array. A shared capacitor electrode is shared by the vertically opposed capacitors in individual of the pairs, with the shared capacitor electrode being alongside laterally-outer sides of the upper and lower capacitor electrode linings. A capacitor insulator is between the shared capacitor electrode and the upper and lower capacitor electrode linings. Upper transistors are individually elevationally outward of and electrically coupled to one of the upper capacitor electrode linings to comprise one 1T-1C memory cell of the array. Lower transistors are individually elevationally inward of and electrically coupled to one of the lower capacitor electrode linings to comprise another 1T-1C memory cell of the array.

In some embodiments, a memory array comprises pairs of vertically opposed capacitors, with the pairs of vertically opposed capacitors individually comprising an upper capacitor electrode lining and a lower capacitor electrode lining that are elevationally separate and spaced from one another. The capacitors in individual of the pairs of vertically opposed capacitors individually are in a same individual 2T-2C memory cell of the memory array. A shared capacitor electrode is shared by the vertically opposed capacitors in individual of the pairs of vertically opposed capacitors, with the shared capacitor electrode being alongside laterally-outer sides of the upper and lower capacitor electrode linings. A capacitor insulator is between the shared capacitor electrode and the upper and lower capacitor electrode linings. Upper transistors are individually elevationally outward of and electrically coupled to one of the upper capacitor electrode linings. Lower transistors are individually elevationally inward of and electrically coupled to one of the lower capacitor electrode linings. Pairs of one of the upper transistors and one of the lower transistors have their respective gates directly electrically coupled together to comprise the individual 2T-2C memory cells of the memory array.

In some embodiments, a memory array comprises pairs of vertically opposed capacitors, with the pairs of vertically opposed capacitors individually comprising an upper capacitor electrode lining and a lower capacitor electrode lining that are elevationally separate and spaced from one another. The capacitors in individual of the pairs of vertically opposed capacitors are individually in two different memory cells of the memory array. A shared capacitor electrode is shared by the vertically opposed capacitors in individual of the pairs of vertically opposed capacitors, with the shared capacitor electrode being alongside laterally-outer sides of the upper and lower capacitor electrode linings. A capacitor insulator is between the shared capacitor electrode and the upper and lower capacitor electrode linings. Upper transistors are individually elevationally outward of and electrically coupled to one of the upper capacitor electrode linings. Pairs of immediately laterally adjacent of the upper transistors have their respective gates directly electrically coupled together to comprise one 2T-2C memory cell of the array. Lower transistors are individually elevationally inward of and electrically coupled to one of the lower capacitor electrode linings, with pairs of immediately laterally adjacent of the lower transistors having their respective gates directly electrically coupled together to comprise another 2T-2C memory cell of the array.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. Memory circuitry comprising:
    pairs of vertically opposed capacitors, the pairs individually comprising an upper capacitor electrode lining and a lower capacitor electrode lining that are above and below one another;
    a shared capacitor electrode that is shared by the vertically opposed capacitors in individual of the pairs, the shared capacitor electrode being alongside laterally-outer sides of the upper and lower capacitor electrode linings;
    a capacitor insulator between the shared capacitor electrode and the upper and lower capacitor electrode linings; and
    a transistor directly above and a transistor directly below the individual pairs of vertically opposed capacitors.

2. The memory circuitry of claim 1 wherein the capacitor insulator comprises ferroelectric material such that the capacitors are non-volatile and programmable into at least two different magnitude capacitive states.

3. The memory circuitry of claim 1 wherein the capacitor insulator comprises dielectric material such that the capacitors are volatile.

4. The memory circuitry of claim 1 wherein,
    the upper capacitor electrode lining comprises a downwardly-facing container shape comprising sidewalls and a top extending laterally to and between the sidewalls of the upper capacitor electrode lining; and
    the lower capacitor electrode lining comprises an upwardly-facing container shape comprising sidewalls and a bottom extending laterally to and between the sidewalls of the lower capacitor electrode lining.

5. The memory circuitry of claim 4 comprising a dielectric pillar extending elevationally within and elevationally between each of the upper and lower capacitor electrode linings.

6. The memory circuitry of claim 5 wherein the pillar is laterally wider elevationally between than within the upper and lower capacitor electrode linings in vertical cross-section.

7. The memory circuitry of claim 5 wherein the pillar is formed to be, from side-to-side, entirely solid from top to bottom in horizontal cross-section.

8. The memory circuitry of claim 1 wherein the upper capacitor electrode lining and the lower capacitor electrode lining are totally encircling in the individual capacitor openings in horizontal cross-section.

9. Memory circuitry comprising:
    pairs of vertically opposed capacitors, the pairs individually comprising an upper capacitor electrode lining and a lower capacitor electrode lining that are above and below one another, the upper capacitor electrode lining defining an upper void space laterally between sidewalls of the upper capacitor electrode lining in vertical cross-section, the lower capacitor electrode lining defining a lower void space laterally between sidewalls of the lower capacitor electrode lining in the vertical cross-section, mid void space being elevationally between the upper and lower capacitor electrode linings in the vertical cross-section;

insulative material filling all of the upper, lower, and mid void spaces;

a shared capacitor electrode that is shared by the vertically opposed capacitors in individual of the pairs, the shared capacitor electrode being alongside laterally-outer sides of the upper and lower capacitor electrode linings;

a capacitor insulator between the shared capacitor electrode and the upper and lower capacitor electrode linings; and a transistor directly above and a transistor directly below the individual pairs of vertically opposed capacitors.

10. The memory circuitry of claim 9 wherein the insulative material is laterally wider in the mid void space than within the upper and lower void spaces in the vertical cross-section.

11. The memory circuitry of claim 9 wherein the insulative material that is in the mid void space does not extend laterally outward beyond laterally-outer sides of the upper and lower capacitor electrode linings in the vertical cross-section.

12. The memory circuitry of claim 9 wherein the insulative material that is in the mid void space and laterally-outer sides of the upper and lower capacitor electrode linings have laterally-outermost coincident surfaces in the vertical cross-section.

13. Memory circuitry comprising:
pairs of vertically opposed capacitors, the pairs individually comprising an upper capacitor electrode lining and a lower capacitor electrode lining that are above and below one another, the capacitors in individual of the pairs individually being in two different memory cells of the memory circuitry;

a shared capacitor electrode that is shared by the vertically opposed capacitors in individual of the pairs, the shared capacitor electrode being alongside laterally-outer sides of the upper and lower capacitor electrode linings;

a capacitor insulator between the shared capacitor electrode and the upper and lower capacitor electrode linings;

upper transistors individually directly above of and electrically coupled to one of the upper capacitor electrode linings to comprise one 1T-1C memory cell of the memory circuitry; and lower transistors individually directly under of and electrically coupled to one of the lower capacitor electrode linings to comprise another 1T-1C memory cell of the memory circuitry.

14. The memory circuitry of claim 13 wherein the lower transistors extend elevationally.

15. The memory circuitry of claim 14 wherein the lower transistors are vertical transistors.

16. The memory circuitry of claim 13 wherein the upper transistors extend elevationally.

17. The memory circuitry of claim 16 wherein the upper transistors are vertical transistors.

18. The memory circuitry of claim 13 wherein the upper transistors are directly electrically coupled to the respective one upper capacitor electrode lining and the lower transistors are directly electrically coupled to the respective one lower capacitor electrode lining.

19. The memory circuitry of claim 13 wherein,
the upper capacitor electrode lining comprises a downwardly-facing container shape comprising sidewalls and a top extending laterally to and between the sidewalls of the upper capacitor electrode lining;
the lower capacitor electrode lining comprises an upwardly-facing container shape comprising sidewalls and a top extending laterally to and between the sidewalls of the lower capacitor electrode lining; and
further comprising:
a dielectric pillar extending elevationally within and elevationally between each of the upper and lower capacitor electrode linings, the pillar being laterally wider elevationally between than within the upper and lower capacitor electrode linings in vertical cross-section.

* * * * *